(12) United States Patent
Kozuma et al.

(10) Patent No.: US 7,649,787 B2
(45) Date of Patent: Jan. 19, 2010

(54) SEMICONDUCTOR DEVICE

(75) Inventors: Munehiro Kozuma, Kanagawa (JP); Yoshiyuki Kurokawa, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 120 days.

(21) Appl. No.: 11/846,981

(22) Filed: Aug. 29, 2007

(65) Prior Publication Data
US 2008/0259693 A1 Oct. 23, 2008

(30) Foreign Application Priority Data
Sep. 5, 2006 (JP) ............................. 2006-240540

(51) Int. Cl.
*G11C 7/10* (2006.01)
(52) U.S. Cl. .................. 365/189.05; 365/227; 365/228
(58) Field of Classification Search ............ 365/189.05, 365/227, 228
See application file for complete search history.

(56) References Cited

U.S. PATENT DOCUMENTS 4,240,151 A * 12/1980 Kawagoe .................... 365/104
4,661,927 A * 4/1987 Graebel ...................... 365/175
4,805,143 A * 2/1989 Matsumoto et al. ......... 365/104
5,226,014 A * 7/1993 McManus ................... 365/203
5,761,700 A * 6/1998 Cozart et al. ................ 711/102
6,906,974 B2 * 6/2005 Jeung .......................... 365/207
7,130,234 B2    10/2006 Shionoiri et al.
7,274,210 B2 * 9/2007 Ogata .......................... 326/38
7,366,051 B2 * 4/2008 Ueda ..................... 365/230.06
2007/0028194 A1    2/2007 Kurokawa
2007/0029994 A1    2/2007 Dembo
2007/0126059 A1    6/2007 Dembo et al.

OTHER PUBLICATIONS

Dembo, H. et al, "RFCPUs on Glass and Plastic Substrates Fabricated by TFT Transfer Technology," IEEE Technical Digest of International Electron Devices Meeting, Washington DC, Dec. 5-7, 2005, pp. 1067-1069.

* cited by examiner

*Primary Examiner*—Viet Q Nguyen
(74) *Attorney, Agent, or Firm*—Cook Alex Ltd.

(57) ABSTRACT

A memory circuit includes a plurality of word lines, a plurality of bit lines, and a plurality of memory cells. Configurations of the plurality of memory cells are determined depending on the data ("high" or "low") which is stored in the memory cells. Data array such as a program stored in the memory circuit is analyzed in advance. In the case where "high" is the majority data, memory cells storing "high" are formed with vacant cells in which a semiconductor element is not formed.

12 Claims, 16 Drawing Sheets

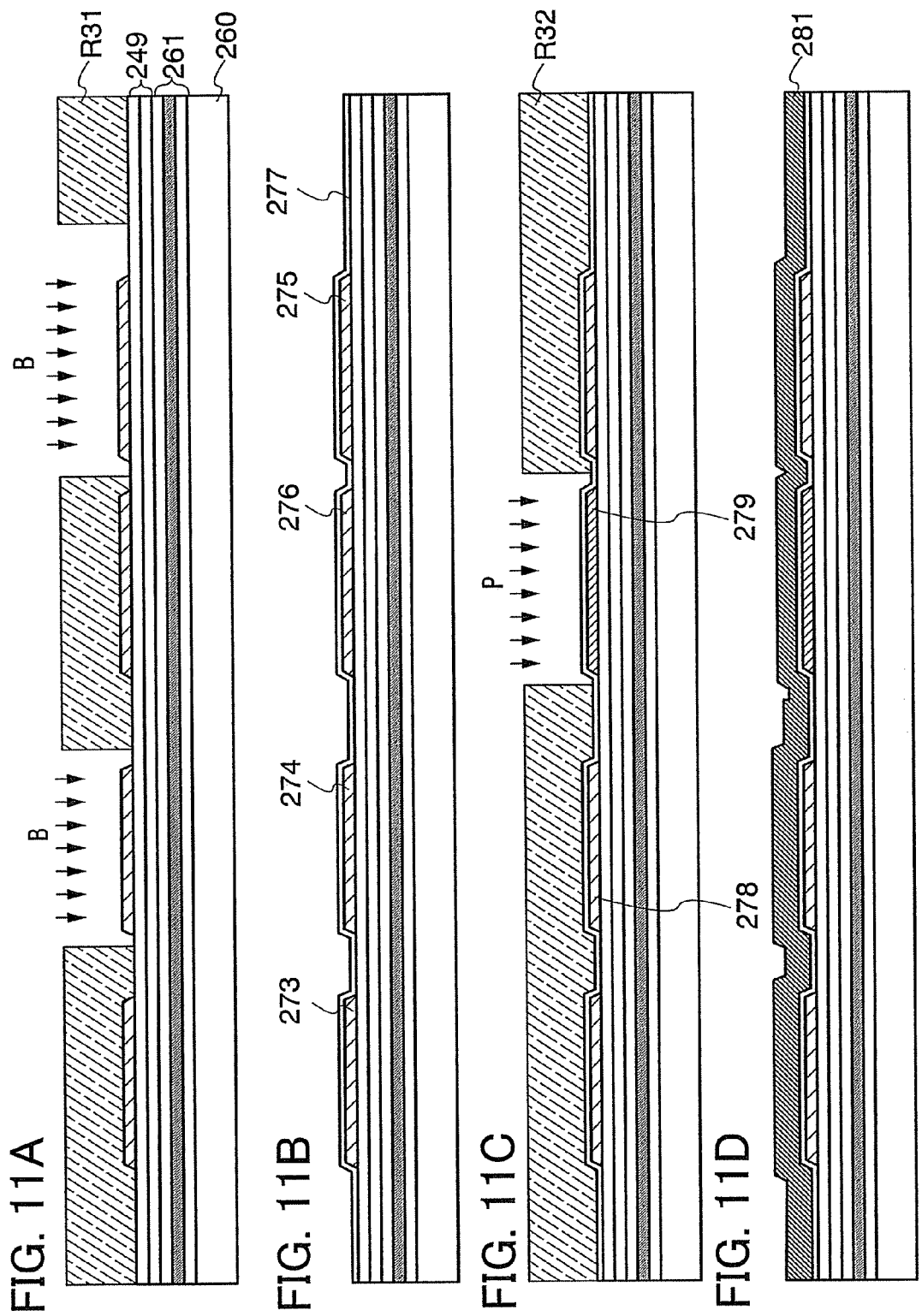

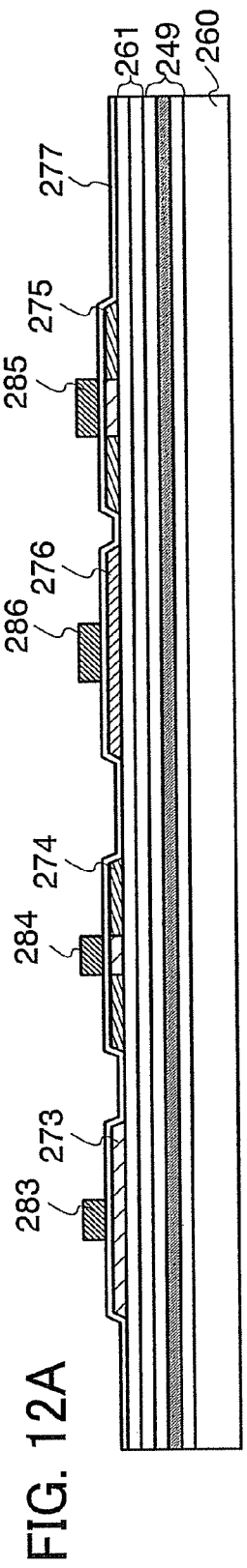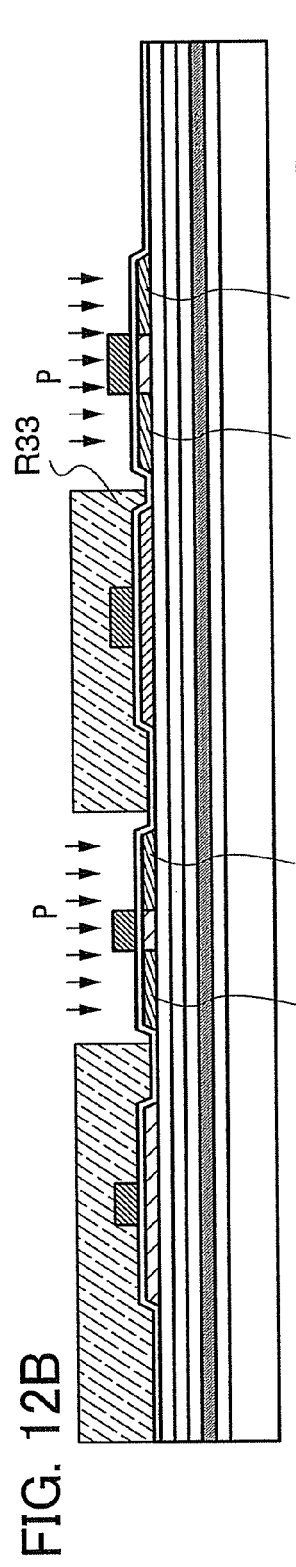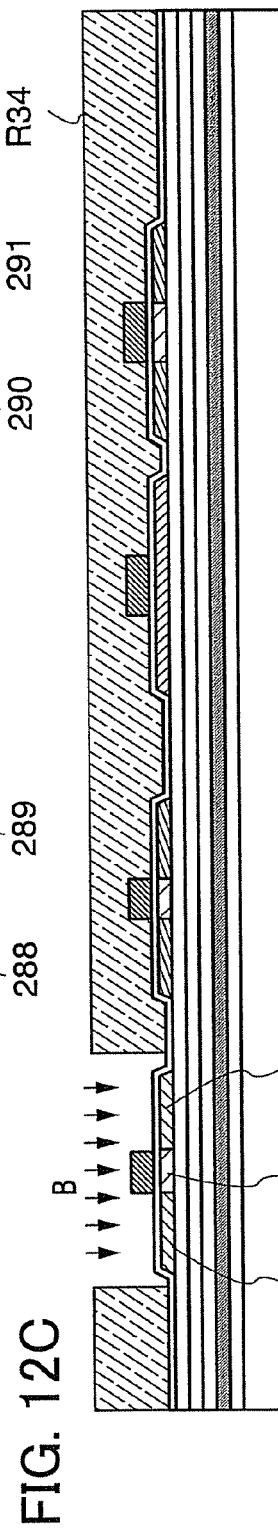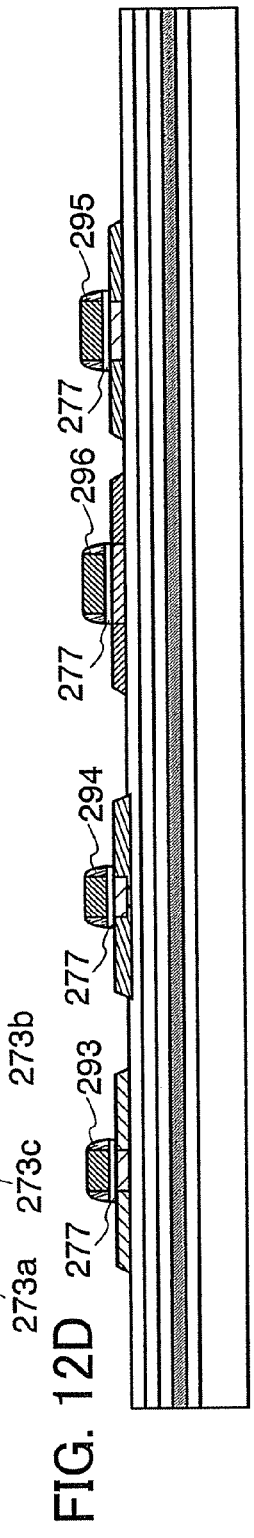

SEMICONDUCTOR DEVICE

BACKGROUND OF THE INVENTION

1. Field of the Invention

The present invention relates to a semiconductor device including a memory circuit.

2. Description of the Related Art

Now products with CPUs, e.g. appliances and computers, have spread in the world and serve as necessities in our life. Generally, these products are equipped with integrated circuit components such as a dedicated circuit having a specific function, a memory, and the like. For example, in a product with a CPU and a memory, the memory functions as a program storage area or working area of the CPU.

As a product with a CPU and a memory, for example, a semiconductor device capable of radio communication as disclosed in Reference 1 (Hiroki Dembo et al, "RFCPUs on Glass and Plastic Substrates Fabricated by TFT Transfer Technology", IEEE, TECHNICAL DIGEST OF INTERNATIONAL ELECTRON DEVICES MEETING, Dec. 5, 2005, pp. 1067-1069) is well known. Such a semiconductor device is called a wireless chip, wireless IC, or the like For improvement in performance of a product with a CPU, the CPU is required to improve in operation speed. Furthermore, for improvement in operation speed of the CPU, a memory is required to operate at higher speed. As a result, power consumption of the memory accounts for the major part of that of a circuit portion. However, the fact is that there is no attempt to reduce power consumption in the aspect of the whole system integrated with the CPU and memory although the power consumption of individual components is attempted to be cut down, for in general the CPU and the memory are designed separately as versatile components.

SUMMARY OF THE INVENTION

The present invention is devised in view of the above problems. An object of the present invention is to reduce the power consumption of a semiconductor device including a memory and a circuit (e.g. CPU, dedicated circuit, and the like) operating with the use of data stored in the memory.

Another object of the present invention is to reduce the power consumption of a semiconductor device by determining configurations of memory cells according to data stored in a memory circuit (e.g. data used in the CPU or in the dedicated circuit) and to provide semiconductor device with less heat generation.

In the present invention, the memory circuit includes a plurality of word lines, a plurality of bit lines intersecting the word lines, a plurality of memory cells provided in each intersecting area of one of the word lines and one of the bit lines, a plurality of latch circuits connected to different bit lines on an output side of the memory cells in the last row, and a plurality of pre-charge circuits connected to different bit lines on an output side of the latch circuits.

One of the features of the memory circuit according to the present invention is that data stored in the memory cell comprises high and low; the plurality of memory cells each store either high or low; a semiconductor element is not formed in the memory cell which stores the major signals of high and low which constitute the data; and a semiconductor element connected to the word line and the bit line is formed in the memory cell which stores the minor signals of high and low.

One of the features of the memory circuit according to the present invention is that in at least one word line, the semiconductor element is not formed in the plurality of memory cells formed corresponding to the aforementioned word lines. In this case, the major signals of high and low which constitute the data is stored in the memory cells in which the semiconductor element is not formed.

In the present invention, a diode, a transistor, a memory element, or the like can be used as a semiconductor element for a memory cell.

Power consumption of the semiconductor device according to the present invention can be reduced by forming a memory cell with no semiconductor element. Furthermore, heat generation can be suppressed owing to the low power consumption.

BRIEF DESCRIPTION OF THE DRAWINGS

In the accompanying drawings:

FIGS. 11A to 11D are cross-sectional views illustrating the steps of making the wireless chip according to the present invention;

FIGS. 12A to 12D are cross-sectional views for illustrating the steps of making the wireless chip according to the present invention;

DETAILED DESCRIPTION OF THE INVENTION

Figure 1:
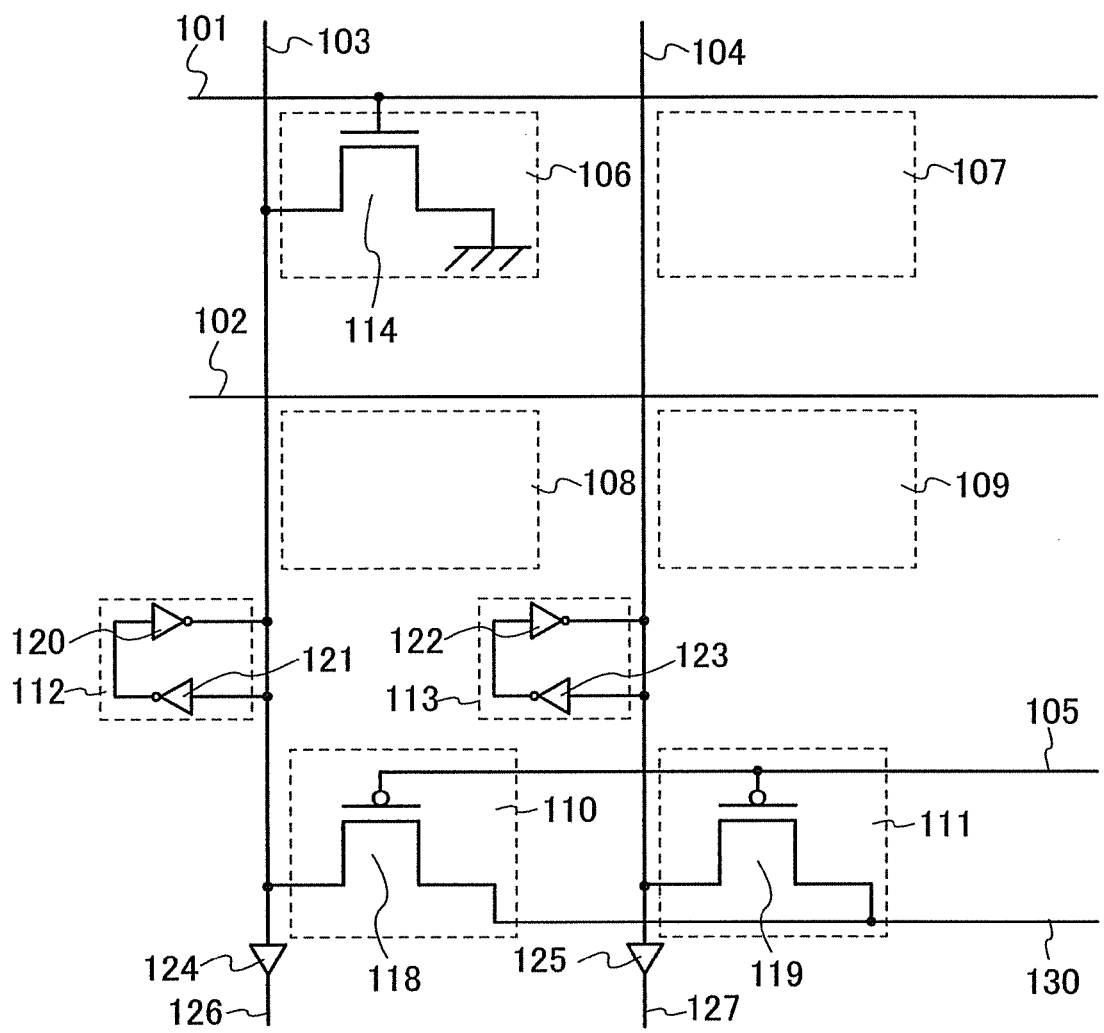
FIG. 1 is a diagram of the memory circuit according to the present invention.

Embodiment modes of the present invention will be described with reference to drawings. The present invention can be carried out in many different modes, however, and it is easily understood by those skilled in the art that the modes and details disclosed herein can be modified in various ways without departing from the spirit and the scope of the present invention. Therefore, the present invention should not be interpreted as being limited to the description of the embodiment modes to be given below. Note that in all the drawings that illustrate the embodiment modes, the same reference numerals are used for the same portions or the portions having similar functions, and the repeated description thereof is omitted.

EMBODIMENT MODE 1

Figure 3:
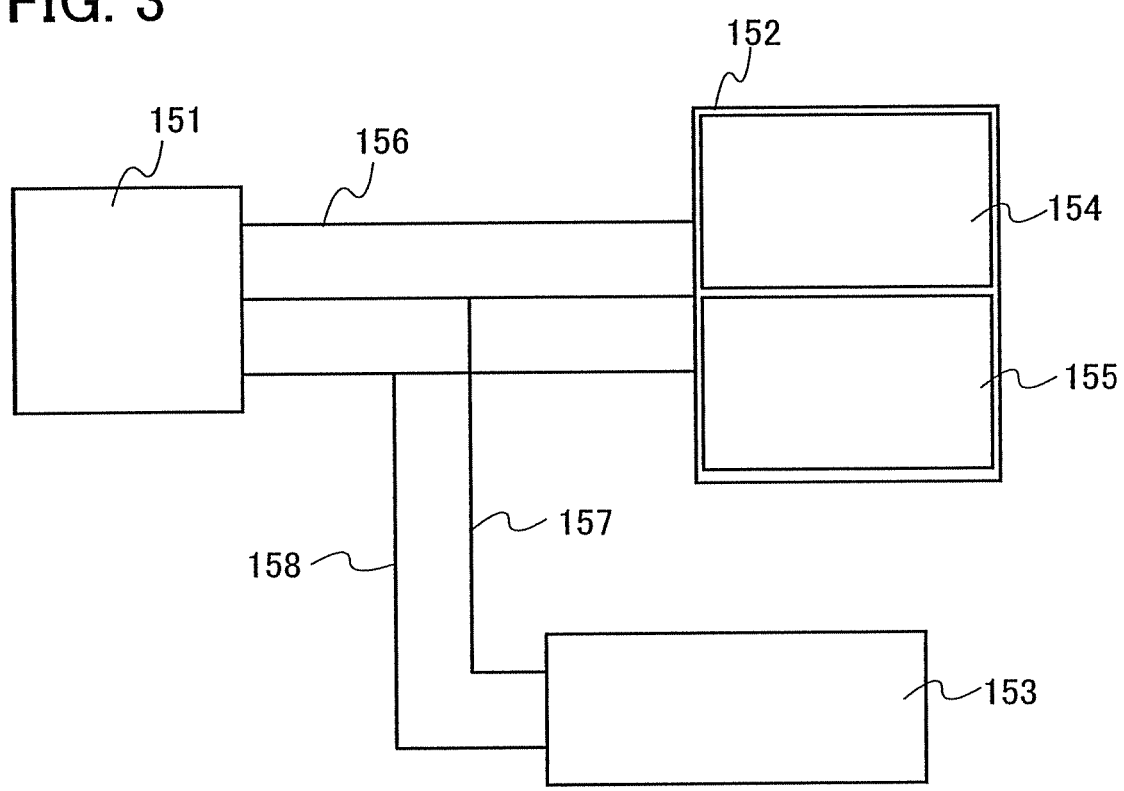
FIG. 3 is a block diagram showing a configuration example of the semiconductor device including the memory and the CPU.

In Embodiment Mode 1, an explanation of a semiconductor device including a memory and a CPU will be given. FIG. 3 is a block diagram showing a configuration example of the semiconductor device including the memory and the CPU.

As is shown in FIG. 3, the semiconductor device includes a CPU 151, a main memory 152, an input/output interface 153, an address bus 156, a data bus 157, and a controller bus 158. The main memory 152 includes a ROM 154 and a RAM 155. The ROM 154 is used as a program memory which stores a program executed by the CPU 151. The RAM 155 serves as a working memory for executing a program by the CPU 151.

The CPU 151 and the main memory 152 are connected via the address bus 156. Furthermore, the CPU 151, the main memory 152, and the input/output interface 153 are connected to each other via the data bus 157 and the controller bus 158.

The CPU 151 controls operation of an apparatus, and data required for the CPU 151 to execute a program is stored in the ROM 154 included in the main memory 152. The ROM 154 is a memory circuit only for reading out data. Data stored in the ROM 154 is fixed in a making stage. Since programming data required for the CPU 151 to execute a command or a process is stored in the ROM 154, the process operation of the CPU 151 and the data reading from the main memory 152 are performed repeatedly. The ROM 154 consumes electricity in reading out the data required for the CPU 151 operation. The RAM 155 is a memory circuit to which data can be written or rewritten. The RAM 155 is used mainly for storing a processing result of the CPU 151 in the process of programming. Input of a signal from an external device and output of a signal such as a processing result to an external device are carried out via the input/output interface 153.

Data used in the semiconductor device shown in FIG. 3, such as is stored in the main memory 152, is described in binary scale: that is, the data is described as "1" or "0". Hereinafter, the "1" and "0" which constitute the data are described as "high" and "low" respectively according to the potential of a signal.

The address bus 156 is a wiring (route) for transmitting commands or data required by the CPU 151 to the main memory 152. The data bus 157 is a wiring (route) for reading out and writing data from/to the main memory 152, and for obtaining and providing data from/for an external device via the input/output interface 153. The controller bus 158 is a wiring (route) for providing control information for the main memory 152 and the input/output interface 153.

Figure 4:
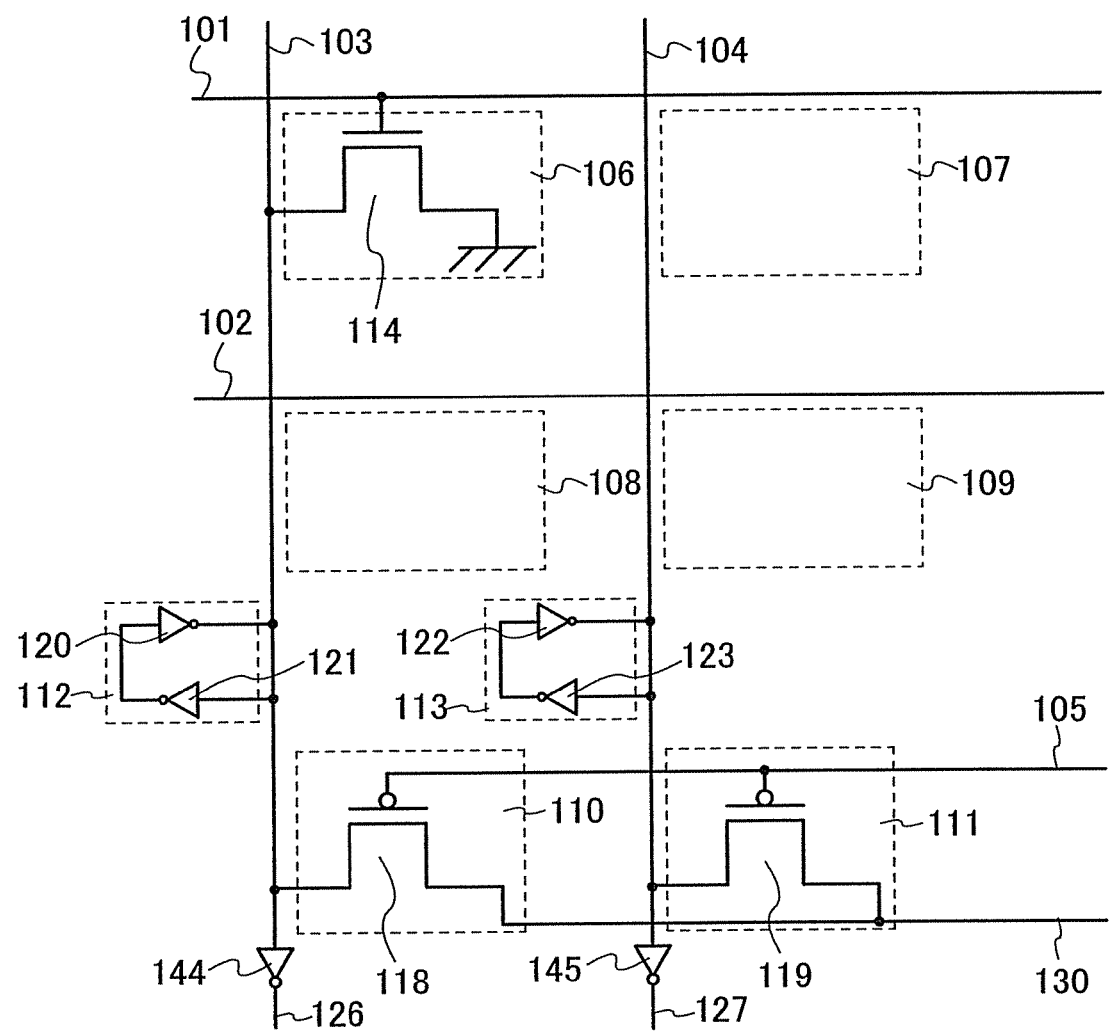
FIG. 4 is a diagram of the memory circuit according to the present invention.

A configuration of the ROM 154 will now be described with reference to FIG. 1 and FIG. 4. FIG. 1 is a circuit diagram showing a configuration example where "high" is a majority in the data stored in the ROM 154. FIG. 4 is a circuit diagram showing a configuration example where "low" is a majority in the data stored in the ROM 154.

In order to determine the configuration of the ROM 154, data stored in the ROM 154, e.g. a program required by the CPU 151, is analyzed to determine which of "high" and "low" is the majority. By determining the configuration of the ROM 154 according to a result, the whole power consumption of the semiconductor device can be reduced. First, a circuit configuration example of the ROM 154 where "high" is a majority will be described with reference to FIG. 1.

As is shown in FIG. 1, the ROM 154 includes a first word line 101, a second word line 102, a first bit line 103, a second bit line 104, a first memory cell 106, a second memory cell 107, a third memory cell 108, and a fourth memory cell 109.

Furthermore, as a device for reading out data from these memory cells (106 to 109), the memory circuit according to Embodiment Mode 1 includes a first pre-charge circuit 110, a second pre-charge circuit 111, a first latch circuit 112, a second latch circuit 113, a first buffer 124, a second buffer 125, a first memory output line 126, and a second memory output line 127. The first pre-charge circuit 110 has a function of setting a pre-charge line 105 at a first potential, thereby setting the first bit line 103 at a second potential. The second pre-charge circuit 111 has a function of setting the pre-charge line 105 at a third potential, thereby setting the second bit line 104 at a fourth potential. The first latch circuit 112 has a function of holding the second potential of the first bit line 103. The second latch circuit 113 has a function of holding the fourth potential of the second bit line 104.

A configuration example of the ROM 154 (a memory circuit) in FIG. 1 shows an example in which the number of word lines and bit lines is each two, and the four memory cells are arrayed in two columns and two rows. The number of word lines and bit lines, and the array and the number of memory cells are not limited to the configuration example shown in FIG. 1. More than two word lines and more than two bit lines can be provided. According to the number of these wirings, the array and the number of the memory cells are determined. This is also the same with configuration examples of memory circuits shown in other drawings.

As is shown in FIG. 1, the word lines (101 and 102) and the bit lines (103 and 104) are crossed, and the memory cells (106 to 109) are provided in four regions (enclosed by dotted lines) defined by crossing of the two word lines (101 and 102) and the two bit lines (103 and 104).

The first memory cell 106 is a cell including a semiconductor element connected to the bit line and the word line, and is provided in a region defined by crossing of the first word line 101 and the first bit line 103. The second memory cell 107 is a vacant cell, and is arrayed in a region defined by crossing of the first word line 101 and the second bit line 104. The third memory cell 108 is a vacant cell, and is provided in a region defined by crossing of the second word line 102 and the first bit line 103. The fourth memory cell 109 is a vacant cell, and is arrayed in a region defined by crossing of the second word line 102 and the second bit line 104. The vacant cell indicates a cell which does not include a semiconductor element such as a diode, transistor, or memory element; that is, a memory cell whose inside is vacant.

The first memory cell 106 is a cell which includes a semiconductor element. A transistor, diode, memory element (or memory transistor), or the like can be used as the semiconductor element. In Embodiment Mode 1, an example in which a transistor is used as a semiconductor element is shown. In FIG. 1, an n-channel transistor 114 is used as a transistor formed in a memory cell.

In the first memory cell 106, a gate electrode of the n-channel transistor 114 is connected the first word line 101; a source electrode thereof is connected to the first bit line 103; a drain electrode thereof is connected to a predetermined line so as to have a fixed potential; and in the configuration example shown in FIG. 1, the drain electrode is connected to a ground potential terminal. In this specification, a cell including a semiconductor element whose electrode is connected to a ground potential terminal is referred to as a "grounded cell"; accordingly, the first memory cell 106 is a grounded cell.

The first latch circuit 112 and the first pre-charge circuit 110 are connected to the first bit line 103 in sequence on the output side of the third memory cell 108 (the memory cell in the last row), and an input terminal of the first buffer 124 is connected to an output terminal of the first bit line 103. In the same manner as the first bit line 103, the second latch circuit 113 and the second pre-charge circuit 111 are connected to the second bit line 104 in sequence on the output side of the fourth memory cell 109 (the memory cell in the last row); and an input terminal of the second buffer 125 is connected to an output terminal of the second bit line 104.

The first latch circuit 112 and the second latch circuit 113 have the same configuration, and each of them has two inverters. The first latch circuit 112 includes inverters 120 and 121, and the second latch circuit 113 includes inverters 122 and 123. Note that the first latch circuit 112 and the second latch circuit 113 can also be configured with capacitors.

The first pre-charge circuit 110 and the second pre-charge circuit 111 have the same configuration, and each of them has a transistor. The first pre-charge circuit 110 includes a first p-channel transistor 118 for pre-charging, and the second pre-charge circuit 111 includes a second p-channel transistor 119 for pre-charging. Gate electrodes of the first p-channel transistor 118 for pre-charging and the second p-channel transistor 119 for pre-charging are connected in common to the pre-charge line 105, and source electrodes thereof are connected in common to a power supply line 130. A drain electrode of the first p-channel transistor 118 for pre-charging is connected to the first bit line 103, and a drain electrode of the second p-channel transistor 119 for pre-charging is connected to the second bit line 104. The potential of the power supply line 130 is fixed at a constant potential.

An output terminal of the first buffer 124 is connected to the first memory output line 126, and an output terminal of the second buffer 125 is connected to the second memory output line 127.

Next, an operation of reading out data from the ROM 154 (a memory circuit) shown in FIG. 1 will be described with reference to the timing diagram of FIG. 2. The ROM 154 shown in FIG. 1 is an example of a circuit including the two bit lines and the two word lines; accordingly, one data readout operation includes a first pre-charge signal period 208, a first word signal period 209, a first data holding period 210, a second pre-charge signal period 211, a second word signal period 212, and a second data holding period 213, as is shown in the timing diagram of FIG. 2.

Figure 2:
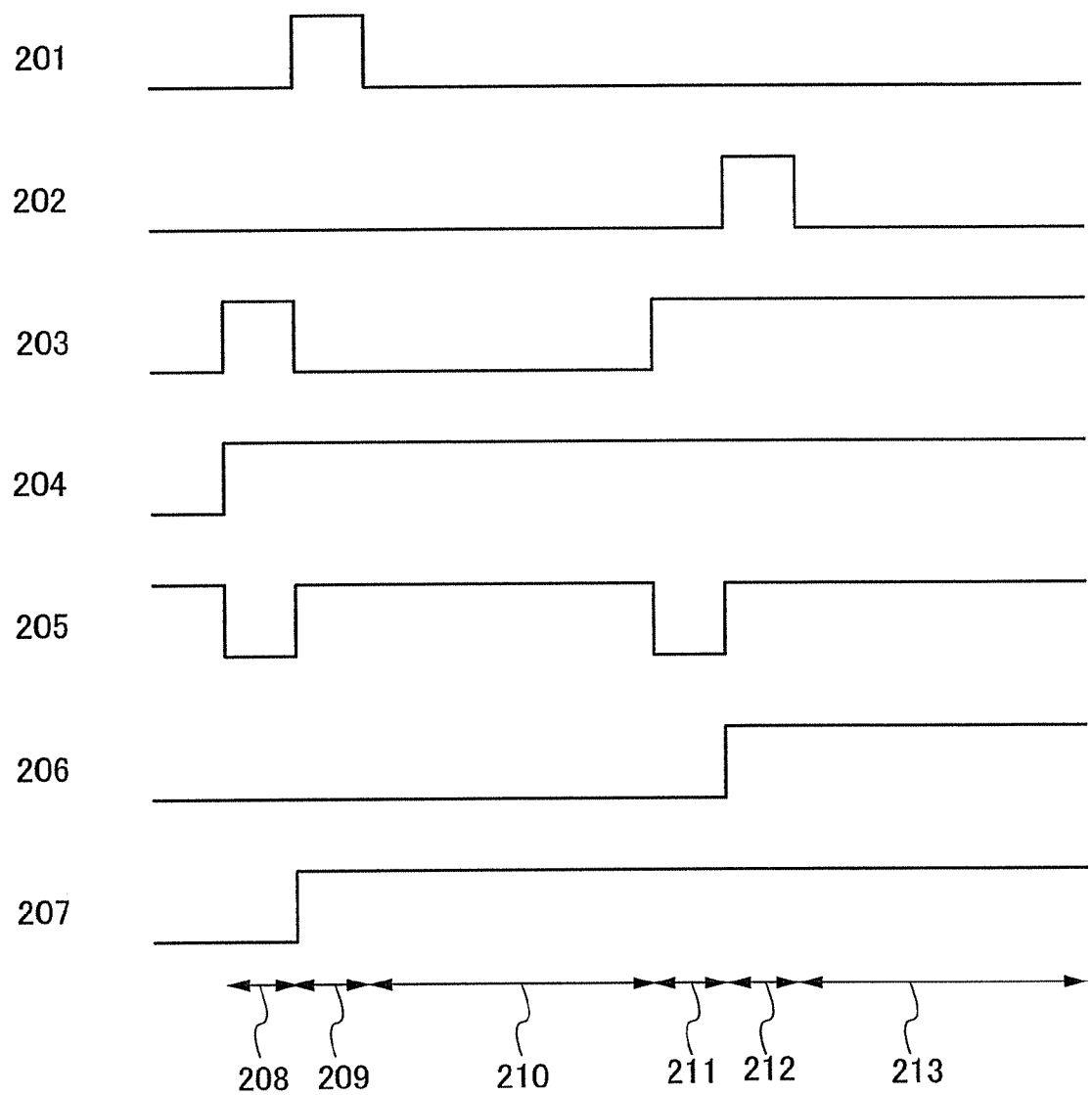
FIG. 2 is a timing diagram of the memory circuit shown in FIG. 1.

In FIG. 2, reference numeral 201 represents a signal which is input to the first word line 101 (the first word signal, hereinafter), and indicates a potential of the first word line 101. Reference numeral 202 represents a signal which is input to the second word line 102 (the second word line, hereinafter). Reference numeral 203 represents a signal which is input to the first bit line 103 (the first bit signal, hereinafter). Reference numeral 204 represents a signal which is input to the second bit line 104 (the second bit signal, hereinafter). Reference numeral 205 represents a signal which is input to the pre-charge line 105 (the pre-charge signal, hereinafter). Reference numeral 206 represents a signal which is output from the first memory output line 126 (the first memory output signal, hereinafter). Reference numeral 207 represents a signal which is output from the second memory output line 127 (the second memory output signal, hereinafter).

First, when the potential of the pre-charge line 105 (the pre-charge signal 205) is set at "low" in the first pre-charge signal period, the potential of the gate electrodes of the first p-channel transistor 118 for pre-charging and the second p-channel transistor 119 for pre-charging become "low". The first bit line 103 is provided with charges from the power supply line 130, which is connected to the source electrode of the first p-channel transistor 118 for pre-charging, via the first p-channel transistor 118 for pre-charging; and the second bit line 104 is also provided with charges from the power supply line 130, which is connected to the source electrode of the second p-channel transistor 119 for pre-charging, via the second p-channel transistor 119 for pre-charging. As a result, the potential of the first bit line 103 (the first bit signal 203) and the potential of the second bit line 104 (the second bit signal 204) become "high". The potential of the first bit line 103 (the first bit signal 203) and the potential of the second bit line 104 (the second bit signal 204) are held by the first latch circuit 112 and the second latch circuit 113, respectively.

Next, the potential of the pre-charge line 105 (the pre-charge signal 205) is set at "high", and the potential of the first word line 101 (the first word signal 201) is also set at "high" in the first word signal period 209. At this point, "high" is applied to the gate electrode of the n-channel transistor 114 in the first memory cell 106 which is connected to the first word line 101. Upon application of "high" to the gate electrode, the potential of the first bit line 103 becomes "low" since the potential of the drain electrode of the n-channel transistor 114 is at the ground potential. On the other hand, the potential of the second bit line 104 remains "high", since the second memory cell 107 is a vacant cell. That is to say, the potential of the first bit line 103 (the first bit signal 203) becomes "low" and the potential of the second bit line 104 (the second bit signal 204) is kept at "high".

Here, the first bit signal 203 is output as "low" to the first memory output line 126 via the first buffer 124, and the second bit signal 204 is output as "high" to the second memory output line 127 via the second buffer 125. That is to say, "low" and "high" are read out from the first memory cell 106 and the second memory cell 107, respectively, which correspond to the first word line 101.

In the first data holding period 210, the potential of the first bit line 103 is held by the first latch circuit 112, and the potential of the second bit line 104 is held by the second latch circuit 113. Accordingly, the potential of the first memory output line 126 is kept at "low", and the potential of the second memory output line 127 is kept at "high".

Next, in the second pre-charge signal period 211, the potential of the pre-charge line 105 (the pre-charge signal 205) is set at "low", and then the potential of the gate electrodes of the first p-channel transistor 118 for pre-charging and the second p-channel transistor 119 for pre-charging become "low". The first bit line is provided with charges from the power supply line 130, which is connected to the source electrode of the first p-channel transistor 118 for pre-charging, via the first p-channel transistor 118 for pre-charging; and the second bit line 104 is also provided with charges from the power supply line 130, which is connected to the source electrode of the second p-channel transistor 119 for pre-charging, via the second p-channel transistor 119 for pre-charging.

The potential of the first bit line 103 (the first bit signal 203) is kept at "high", and the potential of the second bit line 104 is also kept at "high". The potential of the first bit line 103 (the first bit signal 203) and the potential of the second bit line 104 (the second bit signal 204) are held by the first latch circuit 112 and the second latch circuit 113, respectively.

Next, in the second word signal period 212, the potential of the pre-charge line 105 is set at "high", and the potential of the second word line 102 is set at "high". The potential of the first bit line 103 and the second bit line 104 remain "high", since no memory cell is electrically connected to the second word line 102. That is to say, the potential of the first bit line 103 and the second bit line 104 each is "high". After that, the signal of the first bit line 103 is output as "high" to the first memory output line 126 via the first buffer 124, and the signal of the second bit line 104 is output as "high" to the second memory output line 127 via the second buffer 125. That is to say, the data "high" and "high" is read out from the third memory cell 108 and the fourth memory cell 109, respectively.

In the second data holding period 213, the potential of the first bit line 103 is held by the first latch circuit 112, and the potential of the second bit line 104 is held by the second latch circuit 113. Accordingly, the potential of the first memory output line 126 is kept at "high", and the potential of the second memory output line 127 is also kept at "high".

As is described above, the data "low", "high", "high", and "high" is acquired from the first to fourth memory cells 106 to 109, respectively. Since in memory cells storing the data "high" (107 to 109), no semiconductor elements are connected to the word lines, electric power is not consumed in the memory cells in readout operations. Accordingly, extra power consumption can be reduced in the whole semiconductor device. In particular, in the case where a word line is connected to no semiconductor elements as the second word line 102, electric power is not consumed in the word line. Thus, in the case where "high" is a majority in the data stored in a memory circuit, it is desirable that a vacant cell be used for a memory cell storing "high" like a configuration example shown in FIG. 1.

Next, a circuit configuration example of the ROM 154 where "low" is a majority in the data stored in the ROM 154 will be described with reference to FIG. 4.

In FIG. 4, the same reference numerals as those in FIG. 1 indicate the same components as those in FIG. 1. What is different in the configuration of the ROM 154 shown in FIG. 4 from that of FIG. 1 is that the first buffer 124 and the second buffer 125 are replaced with a first inverter 144 and a second inverter 145, respectively; the other components are the same as those in the circuit shown in FIG. 1.

Next, an operation of reading out data from the ROM 154 (a memory circuit) shown in FIG. 4 will be described with reference to the timing diagram of FIG. 5. The ROM 154 shown in FIG. 4 is an example of a circuit including the two bit lines and the two word lines; accordingly, one data readout operation includes a first pre-charge signal period 508, a first word signal period 509, a first data holding period 510, a second pre-charge signal period 511, a second word signal period 512, and a second data holding period 513, as is shown in the timing diagram of FIG. 5.

Figure 5:
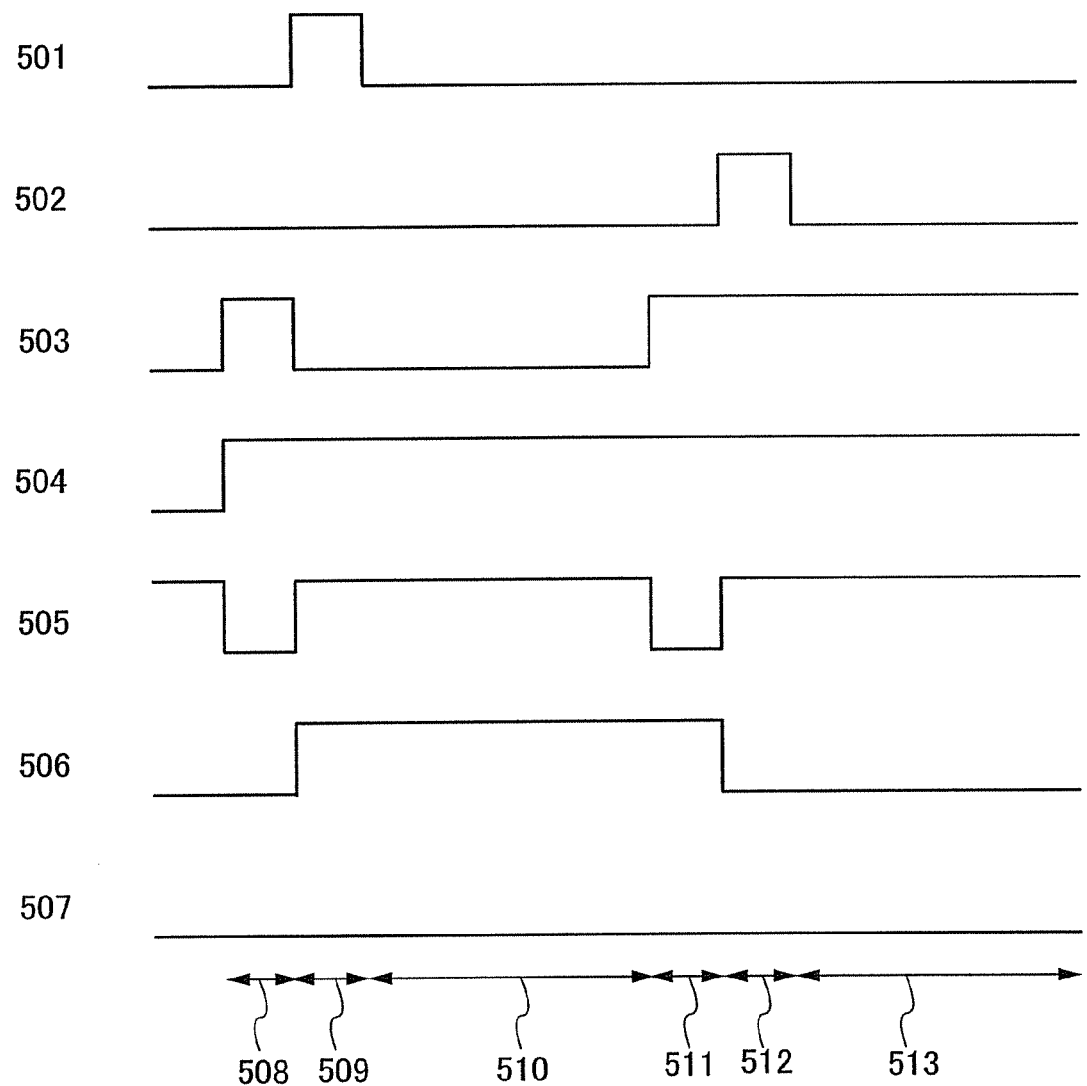
FIG. 5 is a timing diagram of the memory circuit shown in FIG. 4.

In FIG. 5, reference numeral 501 represents a signal which is input in the first word line 101 (the first word signal, hereinafter), and indicates a potential of the first word line 101. Reference numeral 502 represents a signal which is input to the second word line 102 (the second word signal, hereinafter). Reference numeral 503 represents a signal which is input to the first bit line 103 (the first bit signal, hereinafter). Reference numeral 504 represents a signal which is input to the second bit line 104 (the second bit signal, hereinafter). Reference numeral 505 represents a signal which is input to the pre-charge line 105 (the pre-charge signal, hereinafter). Reference numeral 506 represents a signal which is output from the first memory output line 126 (the first memory output signal, hereinafter). Reference numeral 507 represents a signal which is output from the second memory output line 127 (the second memory output signal, hereinafter).

First, the potential of the pre-charge line 105 is set at "low" in the first pre-charge signal period 508. At this time, the potential of the gate electrodes of the first p-channel transistor 118 for pre-charging and the second p-channel transistor 119 for pre-charging become "low". The first bit line 103 is provided with charges from the power supply line 130, which is connected to the source electrode of the first p-channel transistor 118 for pre-charging, via the first p-channel transistor 118 for pre-charging; and the second bit line 104 is also provided with charges from the power supply line 130, which is connected to the source electrode of the second p-channel transistor 119 for pre-charging, via the second p-channel transistor 119 for pre-charging. As a result, the potential of both the first bit line 103 and the second bit line 104 become "high". The potential of the first bit line 103 (the first bit signal 503) and the potential of the second bit line 104 (the second bit signal 504) are held by the first latch circuit 112 and the second latch circuit 113, respectively.

Next, in the first word signal period 509, the potential of the pre-charge line 105 (the pre-charge signal 505) is set at "high". In addition, the potential of the first word line 101 (the first word signal 501) is also set at "high". Thus, "high" is applied to the gate electrode of the n-channel transistor 114 in the first memory cell 106 which is connected to the first word line 101. Upon application of "high" to the gate electrode, the potential of the first bit line 103 (the first bit signal 503) becomes "low" since the potential of the drain electrode of the n-channel transistor 114 is at the ground potential.

On the other hand, the potential of the second bit line 104 (the second bit signal 504) remains "high, since the second memory cell 107 is a vacant cell. That is to say, the potential of the first bit line 103 (the first bit signal 503) becomes "low" and the potential of the second bit line 104 (the second bit signal 504) is kept at "high".

The first bit signal 503 and the second bit signal 504 are input to and inverted in the first inverter 144 and the second inverter 145, respectively. Accordingly, the signal "high" (the first memory output signal 506) is output via the first memory output line 126, and the signal "low" (the second memory output signal 507) is output via the second memory output line 127. That is to say, the data "high" and "low" is read out from the first memory cell 106 and the second memory cell 107, respectively.

In the first data holding period 510, the potential of the first bit line 103 is held by the first latch circuit 112, and the potential of the second bit line 104 is held by the second latch circuit 113. Accordingly, the potential of the first memory output line 126 is kept at "high", and the potential of the second memory output line 127 is kept at "low".

Next, in the second pre-charge signal period 511, the potential of the pre-charge line 105 (the pre charge signal 505) is set at "low". At this time, the potential of the gate electrodes of the first p-channel transistor 118 for pre-charging and the second p-channel transistor 119 for pre-charging become "low". The first bit line 103 is provided with charges from the power supply line 130, which is connected to the source electrode of the first p-channel transistor 118 for pre-charging, via the first p-channel transistor 118 for pre-charging; and the second bit line 104 is also provided with charges from the power supply line 130, which is connected to the source electrode of the second p-channel transistor 119 for pre-charging, via the second p-channel transistor 119 for pre-charging. As a result, the potential of the first bit line 103 (the first bit signal 503) becomes "high", and the potential of the second bit line 104 (the second bit signal 504) becomes "high". The potential of the first bit line 103 and the potential of the second bit line 104 are held by the first latch circuit 112 and the second latch circuit 113, respectively.

Next, in the second word signal period 512, the potential of the pre-charge line 105 (the pre-charge signal 505) is set at "high". In addition, the potential of the second word line 102 (he second word signal 502) is set at "high". The second word line 102 is provided with vacant cells only, and is not electrically connected to transistors; thus, the potential of the first bit line 103 and the second bit line 104 are not operated. Accordingly, the potential of the first bit line 103 (the first bit signal 503) and the potential of the second bit line 104 (the second bit signal 504) are "high".

The signal of the first bit line 103 (the first bit signal 503) and the signal of the second bit line 104 (the second bit signal 504) are input to and inverted in the first inverter 144 and the second inverter 145, respectively. Accordingly, the signal "low" (the first memory output signal 506) is output via the first memory output line 126, and the signal "low" (the second memory output signal 507) is output via the second memory output line 127. Thus, the data "low" and "low" is read out from the third memory cell 108 and the fourth memory cell 109, respectively.

In the second data holding period 513, the potential of the first bit line 103 is held by the first latch circuit 112, and the potential of the second bit line 104 is held by the second latch circuit 113. Accordingly, the potential of the first memory output line 126 is kept at "low", and the potential of the second memory output line 127 is kept at "low".

As is described above, the data "high", "low", "low", and "low" is acquired from the first to fourth memory cells 106 to 109, respectively. Since in memory cells storing the data "low" (107 to 109), no semiconductor elements (in particular, gate electrodes thereof) are connected to the word lines, electric power is not consumed in the memory cells in readout operations. Accordingly, extra power consumption can be reduced in the whole semiconductor device. In particular, in the case where a word line is connected to no semiconductor elements as the second word line 102, electric power is not consumed in the word line. Thus, in the case where "low" is a majority in the data stored in a memory circuit (the ROM 154), it is desirable that a vacant cell be used for a memory cell storing "low" like a configuration example shown in FIG. 4.

In this manner, power consumption can be reduced quite effectively by setting the memory cell storing the majority of the data "high" or "low" vacant according to the data stored in the ROM 154 (e.g. the programming data of the CPU 151). Furthermore, heat generation can be reduced since the power consumption can be reduced. Thus, the configuration of a memory circuit shown in this embodiment mode can provide a semiconductor device with low power consumption and low heat generation.

The memory circuits shown in FIG. 1 and FIG. 4 in Embodiment Mode 1 are in particular suitable for a memory circuit in which data stored in each memory cell is fixed in a making stage (e.g. a mask ROM).

EMBODIMENT MODE 2

As is described in Embodiment Mode 1, a memory circuit can be configured to minimize the power consumption by analyzing the data of a program required by the CPU in the CPU and the memory circuit storing a program (a program memory), which have a close relation with each other in a configuration of a semiconductor device.

In addition, even when the data of a program is not analyzed, the power consumption can be effectively reduced by changing the configuration of the memory according to data of NOP commands of the CPU. In Embodiment Mode 2, such an example will be described.

In Embodiment Mode 2, a plurality of memory cells storing a NOP command are composed of vacant cells in a memory circuit. For example, if a NOP command consists of "high" data (or "1") only, the memory circuit as shown in FIG. 1 (the ROM 154) can be used for a program memory. In the configuration example shown in FIG. 1, the data of the NOP command is stored in the memory cells (108 and 109) which are arrayed in the second row (the second word line 102) of the memory circuit. The memory cells (the third memory cell 108 and the fourth memory cell 109) in the second row are composed of vacant cells only, and the signals "high" and "high" can be read out from the third memory cell 108 and the fourth memory cell 109, respectively. That is to say, the NOP command described in "1" only can be acquired. The above configuration of a memory can reduce the power consumption required for reading out the NOP command. In addition, heat generation can be suppressed owing to the reduction of the power consumption.

If a NOP command is composed of "low" data (or "0") only, the memory circuit as shown in FIG. 4 can be employed. Also in the configuration example shown in FIG. 4, the data of the NOP command is stored in the memory cells (the third memory cell 108 and the fourth memory cell 109) which are arrayed in the second row. The signals "low" and "low" are read out from the third memory cell 108 and the fourth memory cell 109, respectively. That is to say, the NOP command described in "0" only can be acquired. The NOP command can be constructed from the data stored in the third memory cell 108 and the fourth memory cell 109.

As is described above, the power consumption required for reading out the NOP command of the CPU can be reduced by setting a plurality of memory cells storing the NOP command vacant. The power consumption can be effectively reduced in particular by setting all the memory cells formed corresponding to at least one word line vacant.

Although the NOP command is stored in the memory cells (the first and the second memory cells) formed corresponding to the one word line (the first word line 101) in the configuration examples shown in FIGS. 1 and 4, the NOP command can also be stored in memory cells formed corresponding to a plurality of word lines.

The memory circuits shown in FIG. 1 and FIG. 4 in Embodiment Mode 2 are in particular suitable for a memory circuit in which data stored in each memory cell is fixed in a making stage (e.g. a mask ROM).

EMBODIMENT MODE 3

In Embodiment Mode 3, an example of a memory circuit provided with memory cells in place of vacant cells will be described. The memory cells have functions similar to the vacant cells. To be more specific, a semiconductor element, e.g. a transistor, is provided in a memory cell so that the memory cell can function in the similar way to a vacant cell, and the semiconductor element is not electrically connected to a word line. A memory cell including a semiconductor element which is not electrically connected to a word line as described above will be referred to as an "open cell".

Hereinafter, a configuration example of a memory circuit according to Embodiment Mode 3 will be described with reference to FIG. 6. In Embodiment Mode 3, a configuration example is shown where "high" is a majority in the data stored in a memory circuit. The memory circuit shown in FIG. 6 has the same data array as that shown in FIG. 1, and the same reference numerals in FIGS. 1 and 6 indicate the same components.

Figure 6:
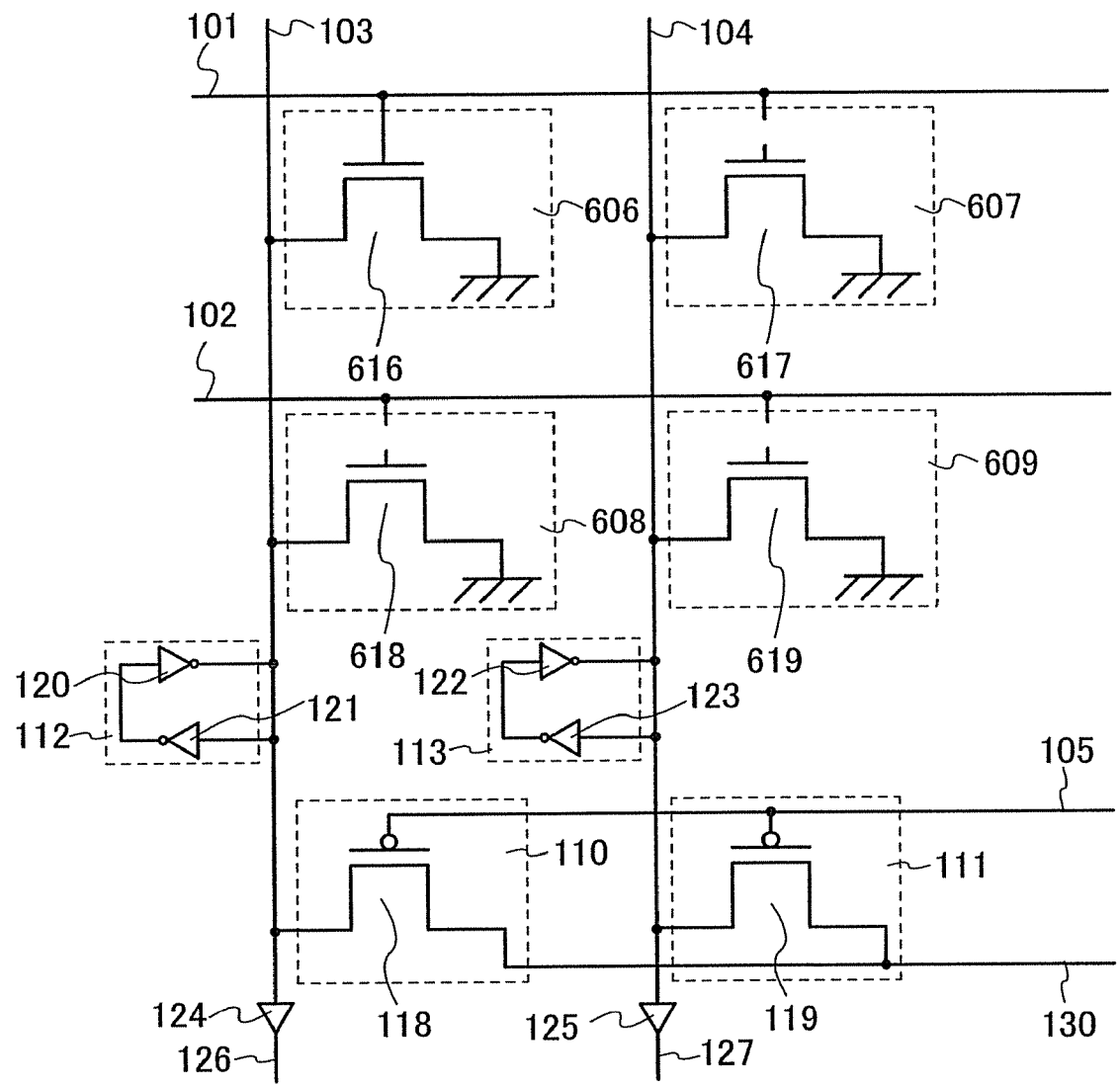
FIG. 6 is a diagram of the memory circuit according to the present invention.

The memory circuit shown in FIG. 6 (the ROM 154) is different from the memory circuit shown in FIG. 1 in the configurations of first to fourth memory cells 606 to 609, and the configurations of the other components are the same as those in the circuit shown in FIG. 1. N-channel transistors 616 to 619 are formed as semiconductor elements in the first to fourth memory cells 606 to 609, respectively.

The first memory cell 606 is a grounded cell like the first memory cell 106 in FIG. 1. A drain electrode of the n-channel transistor 616 is connected to a ground potential terminal; a source electrode thereof is connected to the first bit line 103; and a gate electrode thereof is connected to the first word line 101.

On the other hand, the second memory cell 607, the third memory cell 608, and the fourth memory cell 609 are open cells. In the second memory cell 607, a drain electrode of the n-channel transistor 616 is connected to a ground potential terminal; a source electrode thereof is connected to the second bit line 104; and a gate electrode thereof is not electrically connected to the first word line 101. In the third memory cell 608, a drain electrode of the n-channel transistor 618 is connected to a ground potential terminal; a source electrode thereof is connected to the first bit line 103; and a gate electrode thereof is not electrically connected to the second word line 102. In the fourth memory cell 609, a drain electrode of the n-channel transistor 619 is connected to a ground potential terminal; a source electrode thereof is connected to the second bit line 104; and a gate electrode thereof is not electrically connected to the second word line 102.

Note that "open" in the "open cell" in Embodiment Mode 3 indicates that a word line and a gate electrode of a transistor are not connected to each other. An open cell like the second to fourth memory cells can be formed by not connecting a word line and a gate electrode of an n-channel transistor, for example.

A readout operation of the memory circuit (the ROM 154) in Embodiment Mode 3 is the same as that of the memory circuit shown in FIG. 1. A timing diagram of a data readout operation in Embodiment Mode 3 is also the same as that in FIG. 2.

First, in the first pre-charge signal period 208, the potential of the pre-charge line 105 (the pre-charge signal 205) is set at "low". At this time, the potential of the gate electrode of the first p-channel transistor 118 for pre-charging becomes "low". The first bit line 103 is provided with charges from the power supply line 130, which is connected to the source electrode of the first p-channel transistor 118 for pre-charging, via the first p-channel transistor 118 for pre-charging; and the second bit line 104 is also provided with charges from the power supply line 130, which is connected to the source electrode of the second p-channel transistor 119 for pre-charging, via the second p-channel transistor 119 for pre-charging. As a result, the potential of the first bit line 103 (the first bit signal 203) becomes "high". The potential of the first bit line 103 (the first bit signal 203) is held by the first latch circuit 112.

Next, in the first word signal period 209, the potential of the pre-charge line 105 (the pre-charge signal 205) is set at "high". In addition, the potential of the first word line 101 (the first word signal 201) is also set at "high". Thus, in the first memory cell 606, "high" is applied to the gate electrode of the n-channel transistor 616, which is connected to the first word line 101. Upon application of "high" to the gate electrode, the potential of the first bit line 103 (the first bit signal 203) becomes "low" since the potential of the drain electrode of the n-channel transistor 616 is at the ground potential.

On the other hand, the potential of the second bit line 104 remains "high" since the first word line 101 and the gate electrode of the n-channel transistor 617 are not connected in the second memory cell 607. That is to say, the potential of the second bit line 104 (the second bit signal) is kept at "high".

Thus, in the first word signal period 209, the potential of the first bit line 103 (the first bit signal 203) and the potential of the second bit line 104 (the second bit signal 204) become "low" and "high", respectively. At this point, the first bit signal 203 and the second bit signal 204 are input to the first buffer 124 and the second buffer 125, respectively. The potential of the input signals ("low" and "high") are not changed in the first buffer 124 and the second buffer 125, and are output to the first memory output line 126 and the second memory output line 127, respectively. Accordingly, the signal "low" (the first memory output signal 206) is output via the first memory output line 126, and the signal "high" (the second memory output signal 207) is output via the second memory output line 127. Thus, the data "low" and "high" is read out from the first memory cell 606 and the second memory cell 607, respectively.

In the first data holding period 210, the potential of the first bit line 103 is held by the first latch circuit 112, and the potential of the second bit line 104 is held by the second latch circuit 113. Accordingly, the potential of the first memory output line 126 is kept at "low", and the potential of the second memory output line 127 is kept at "high".

Next, in the second pre-charge signal period 211, the potential of the pre-charge line 105 (the pre-charge signal 205) is set at "low". At this time, the potential of both the gate electrodes of the first p-channel transistor 118 for pre-charging and the second p-channel transistor 119 for pre-charging become low. The first bit line 103 is provided with charges from the power supply line 130, which is connected to the source electrode of the first p-channel transistor 118 for pre-charging, via the first p-channel transistor 118 for pre-charging; and the second bit line 104 is also provided with charges from the power supply line 130, which is connected to the source electrode of the second p-channel transistor 119 for pre-charging, via the second p-channel transistor 119 for pre-charging. The potential of the first bit line 103 becomes "high", and the potential of the second bit line 104 is kept at "high". The potential of the first bit line 103 and the second bit line 104 are held by the first latch circuit 112 and the second latch circuit 113, respectively.

Next, in the second word signal period 212, the potential of the pre-charge line 105 is set at "high", and the potential of the second word line 102 is also set at "high". The potential of the first bit line 103 and the second bit line 104 remain "high" since the second word line 102 is not connected to memory cells, and the potential of the first bit line 103 and the second bit line 104 are not operated. Thus, the potential of both the first bit line 103 and the second bit line 104 are "high". After that, the signal of the first bit line 103 is output as "high" to the first memory output line 126 via the first buffer 124, and the signal of the second bit line 104 is output as "high" to the second memory output line 127 via the second buffer 125. Accordingly, the data "high" and "high" is read out from the first memory cell 608 and the second memory cell 609, respectively.

In the second data holding period 213, the potential of the first bit line 103 is held by the first latch circuit 112, and the potential of the second bit line 104 is held by the second latch circuit 113. Accordingly, the potential of the first memory output line 126 is kept at "high", and the potential of the second memory output line 127 is kept at "high".

In Embodiment Mode 3 described hereinabove, the data "low", "high", "high", and "high" is acquired from the first to fourth memory cells, respectively, and extra power consumption in reading out data can be reduced since the word line and the gate electrode of the memory cell storing the data "high" are not connected to each other. If a word line is not connected to semiconductor elements as the second word line 102, electric power is not consumed in the word line. Accordingly, the electric power necessary for driving the first word line 101 and the second word line 102 can be reduced.

FIG. 6 shows a configuration in which open cells are used for the cells storing "high" when the data "high" is a majority. If "low" is a majority, the open cells may be applied to the memory cells storing "low". The configurations of the components other than the memory cells are the same as those shown in FIG. 4; thus, a memory circuit can be configured to reduce the power consumption in the case where "low" is a majority in the stored data.

According to Embodiment Mode 3, the electric power consumed in row decoders connected to word lines can be reduced in a memory circuit. Furthermore, Embodiment Mode 3 is suitable for manufacturing a large number of memory circuits having different data arrays since data stored in each memory cell can be changed only by the change of exposure masks of a photoresist for forming a word line.

The configuration as described above can provide a semiconductor device equipped with a memory with reduced power consumption.

The memory circuits shown in FIG. 1 and FIG. 4 in Embodiment Mode 3 are in particular suitable for a memory circuit in which data stored in each memory cell is fixed in a making stage (e.g. a mask ROM).

Note that Embodiment Mode 3 can be combined with other embodiment modes and embodiments as necessary.

EMBODIMENT MODE 4

In Embodiment Modes 1 to 3, a read-only memory circuit to which the data is not rewritten, e.g. a ROM, has been explained. In Embodiment Mode 4, a memory circuit to which data can be rewritten will be described. In Embodiment Mode 4, a memory circuit including memory cells, part of which are not rewritable and store fixed data of a semiconductor device will be described.

Figure 7:
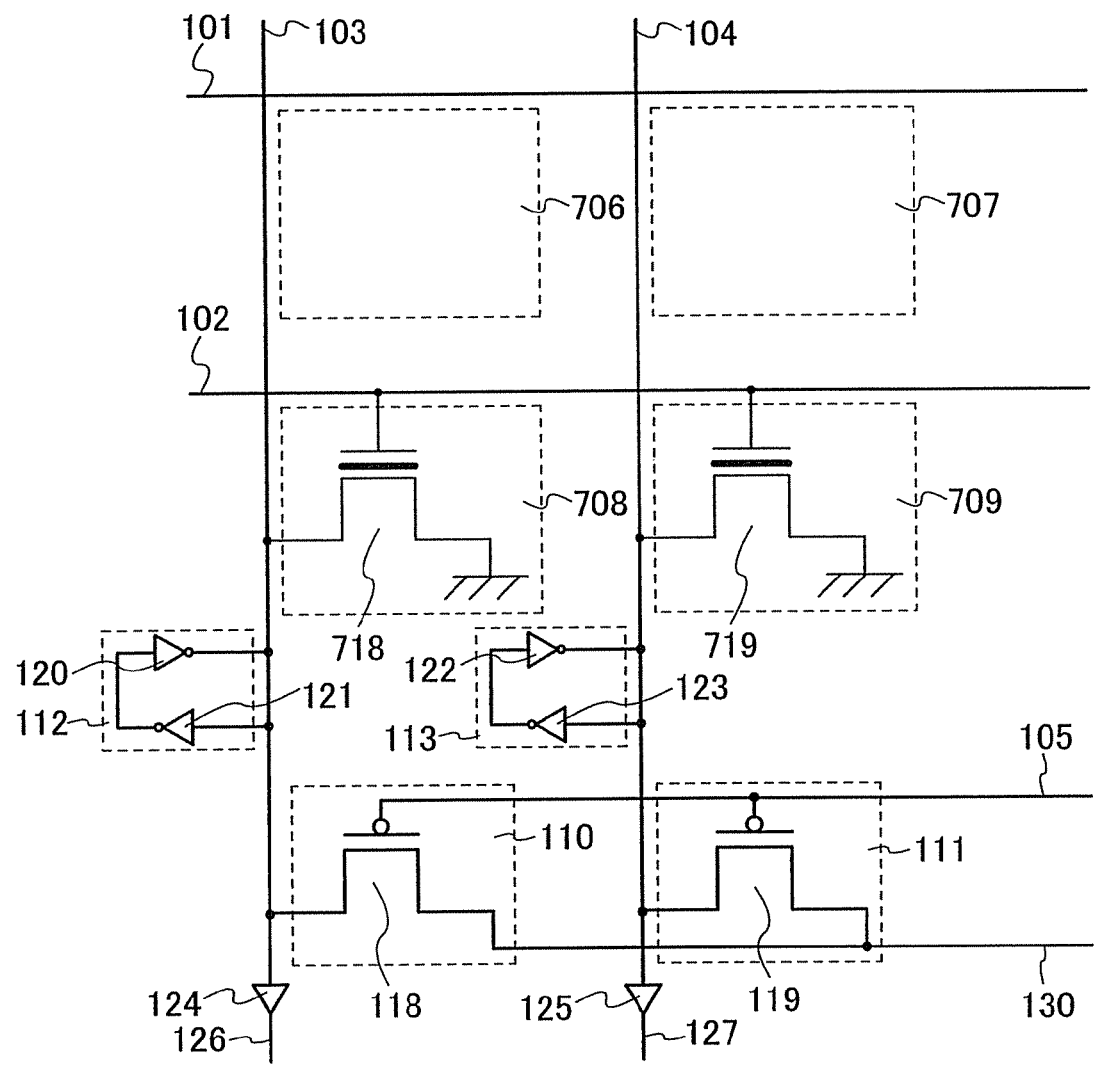
FIG. 7 is a diagram of the memory circuit according to the present invention.

FIG. 7 is a circuit diagram showing a configuration example of a memory circuit of Embodiment Mode 4. The same components in FIGS. 1 and 7 are given the same reference numerals. The memory circuit shown in FIG. 7 is characterized in that a semiconductor element formed in a memory cell is a memory transistor. The memory transistor is, for example, a transistor including a control gate electrode and a floating gate electrode as a gate electrode; or a transistor having a gate insulating film capable of trapping charges.

The memory circuit of Embodiment Mode 4 includes a data non-rewritable region and a data rewritable region. Hence, it has functions of both the non-rewritable ROM 154 and the rewritable RAM 155 in FIG. 3; accordingly, the memory circuit of Embodiment Mode 4 can be used for the main memory 152 in FIG. 3. Therefore, programming data required by a CPU is stored in advance in the non-rewritable region as non-rewritable data. When the CPU executes an arithmetic operation, on the other hand, data which is output from the CPU is stored in the rewritable region. The memory circuit of Embodiment Mode 4 can execute the two operations in one memory circuit.

In the memory circuit shown in FIG. 7, all the memory cells formed corresponding to the first word line 101 store fixed non-rewritable data. In Embodiment Mode 4, an example is shown in which a first memory cell 706 and a second memory cell 707 are vacant cells. The vacant cell indicates a cell which does not include a semiconductor element (in Embodiment Mode 4, a memory element); that is, a memory cell whose inside is vacant. In the memory circuit shown in FIG. 7, an example is shown in which data "high" is stored in vacant cells.

On the other hand, all the memory cells formed corresponding to the second word line 102 are grounded cells including memory transistors. In a third memory cell 708, a memory transistor 718 is formed; a gate electrode thereof is connected to the second word line 102; a source electrode thereof is connected to the first bit line 103; and a drain electrode thereof is connected to the ground potential terminal. Also in a fourth memory cell 709, a memory transistor 719 is formed; a gate electrode thereof is connected to the second word line 102; a source electrode thereof is connected to the second bit line 104; and a drain electrode thereof is connected to the ground potential terminal. If the memory transistors 718 and 719 include control gate electrodes and floating gate electrodes as gate electrodes, the control gate electrodes are connected to the second word line 102.

Next, a data writing operation of the memory circuit shown in FIG. 7 will be described.

Data is written to each memory cell on a row basis (on a word line basis). Here, an example is shown in which a transistor including a control gate electrode and a floating gate electrode is used for the memory transistors 718 and 719, and data is written using electrons, which are hot carriers. In addition, an operation of writing data "high" to the third memory cell 708 and "low" in the fourth memory cell 709 will be described.

Data writing operation is not executed via the first word line 101 since it is not necessary for the memory cells formed corresponding to the first word line 101. First, high potential (potential higher than the ground potential) is applied to the second word line 102. At the same time, high potential (potential for turning on a memory transistor) is applied to the first bit line 103. In the third memory cell 708, current flows into a channel of the first memory transistor 718; high-energy electrons (hot carriers) are generated around the drain electrode; and charges are accumulated in the floating gate electrode. The charges of the floating gate electrode raise the threshold voltage of the control gate electrode high, and the data "high" is stored thereby.

In the fourth memory cell 709, on the other hand, a high voltage is applied to the second word line 102 to set it at high potential, and the second bit line 104 is set at the ground potential. In the fourth memory cell 709, hot carriers are not generated around a drain electrode of the memory transistor 719, and charges are not accumulated in a floating gate electrode. Accordingly, the threshold voltage of the control gate electrode does not change and the data "low" is stored.

As is described above, the memory transistor stores the data "high" or "low" according to a potential state of a floating electrode.

The data written in the memory transistors is erased by opening a drain electrode, connecting a control gate electrode to the ground, and applying a high voltage to a source electrode. Electrons get a high-energy state by the application of the high voltage, and the electrons in the floating gate electrode can be extracted through the source electrode by tunnel effect. Note that the data stored in all the memory cells including the memory elements is erased since a high voltage is applied to the source electrodes of all the memory cells at one time.

Next, a data reading operation will be described.

First, the potential of the pre-charge line 105 (a pre-charge signal) is set at "low". The potential of the gate electrodes of the first p-channel transistor 118 for pre-charging and the second p-channel transistor 119 for pre-charging become "low"; the first bit line 103 is provided with charges from the power supply line 130 via the first p-channel transistor 118 for pre-charging; and the second bit line 104 is also provided with charges from the power supply line 130 via the second p-channel transistor 119 for pre-charging. As a result, the potential of the first bit line 103 (the first bit signal) becomes "high", and the potential of the second bit line 104 (the second bit signal) also becomes "high". The potential of the first bit line 103 (the first bit signal) and the second bit line 104 (the second bit signal) are held by the first latch circuit 112 and the second latch circuit 113, respectively.

Next, the potential of the pre-charge line 105 (the pre-charge signal) is set at "high", and the potential of the second word line 102 (the second word signal) is also set at "high". Thus, in the third memory cell 708, "high" is applied to the control gate electrode of the memory transistor 718. The potential of the first bit line 103 remains "high" since the threshold voltage of the control gate electrode of the memory transistor 718 is higher than the potential "high" of the second word line 102.

In the fourth memory cell 709, on the other hand, "high" is also applied to a control gate electrode of the memory transistor 719. The potential of the second bit line 104 becomes the ground potential, that is, "low" since the threshold voltage of the control gate electrode of the memory transistor 719 is lower than the potential "high" of the second word line 102.

As is described above, the data "high" stored in the third memory cell 708 and "low" stored in the fourth memory cell 709 can be read out.

As is described above, the first memory cell 706 and the second memory cell 707 are vacant cells; therefore, the potential of the first bit line 103 and the second bit line 104 do not change even if the first word signal is given to the first word line. Thus, the data "high" and "high" can be read out from the first memory cell 706 and the second memory cell 707, respectively.

In this manner, the data "high", "high", "high", and "low" can be acquired from the first to fourth memory cells 706 to 709, respectively. That is to say, the data "high" can be read out from the vacant cells, and the data "high" and "low" can be read out from the memory cells composed of memory transistors.

In the configuration example of the memory circuit shown in FIG. 7, a NOP command described in "high" can be stored by employing vacant cells for all the memory cells formed corresponding to the first word line 101.

In the configuration example of the memory circuit shown in FIG. 7, "high" is stored in vacant cells; however, data "low" can be stored in the vacant cells by configuring the components other than the first to fourth memory cells 706 to 709 as in the memory circuit shown in FIG. 4. In this case, if the data is written in the third and fourth memory cells, the data "low", "low", "low", and "high" is acquired from the first to fourth memory cells 706 to 709 since the first inverter 144 and the second inverter 145 are connected to the input sides of the first memory output line 126 and the second memory output line 127, respectively.

In the configuration example shown in FIG. 7, the fixed data is stored in the memory cells formed corresponding to one word line (the first word line 201). However, the fixed data can be stored in memory cells formed corresponding to a plurality of word lines.

In the configuration example shown in FIG. 7, the memory cells storing the fixed data (the non-rewritable data) are composed of vacant cells only. However, data composed of both "high" and "low" can be stored as non-rewritable fixed data by using grounded cells including a transistor like the memory cell 106 shown in FIG. 1 and FIG. 4 in addition to the vacant cells.

In a memory circuit, it is highly effective to employ a vacant cell for a memory cell which stores fixed data in order to reduce the power consumption of row decoders. According to this embodiment mode, the power consumption can be reduced effectively in the whole semiconductor device including the memory circuit and the CPU. Also, heat generation of the semiconductor device can be suppressed owing to the reduction of the power consumption.

EMBODIMENT MODE 5

Figure 8A:
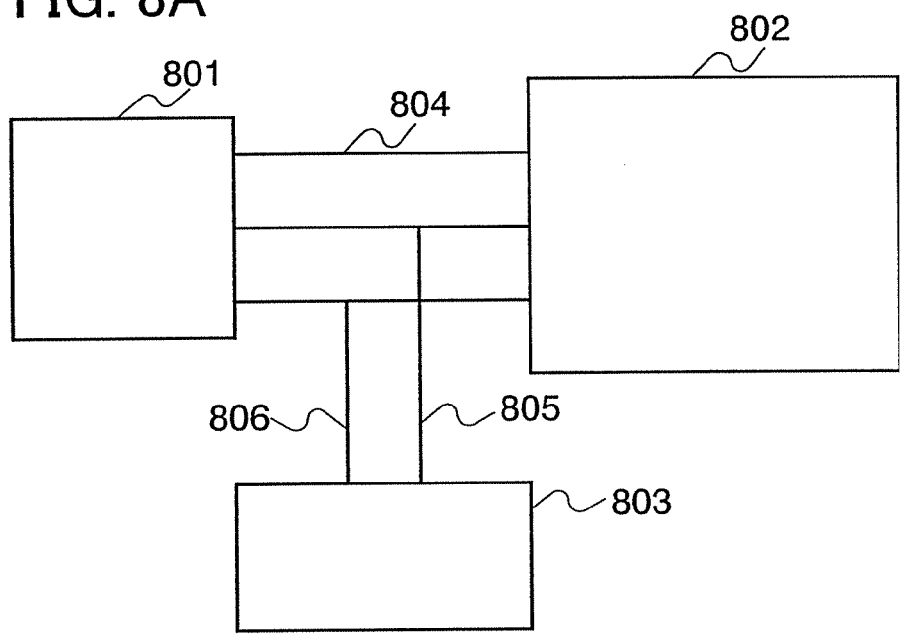
FIGS. 8A and 8B are block diagrams showing configuration examples of the semiconductor device including the memory and the CPU.
Figure 8B:
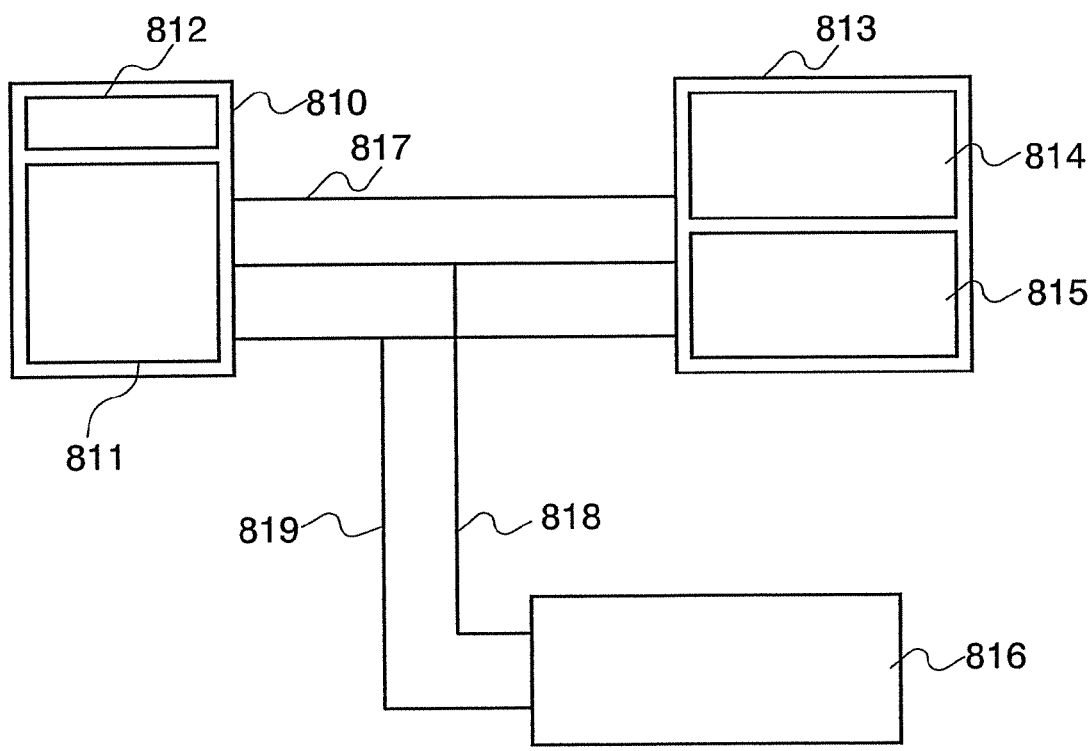

As an embodiment mode of the semiconductor device according to the present invention, a configuration example of a semiconductor device including a memory and a dedicated circuit will be described with reference to FIGS. 8A and 8B. FIGS. 8A and 8B are block diagrams of a semiconductor device according to Embodiment Mode 5.

FIG. 8A is a block diagram showing a configuration example of a semiconductor device including a dedicated circuit and a memory. The semiconductor device shown in FIG. 8A includes a main memory 801, a dedicated circuit 802, an input/output interface 803, an address bus 804, a data bus 805, and a controller bus 806.

The main memory 801 and the dedicated circuit 802 are connected to each other via the address bus 804. Furthermore, the main memory 801, the dedicated circuit 802, and the input/output interface 803 are connected to each other via the data bus 805 and the controller bus 806.

The dedicated circuit 802 is, for example, an image processing circuit or a code processing circuit. Since arithmetic operation is executed in the dedicated circuit 802 with the use of data stored in the main memory 801, data required is stored in the main memory 801. Both the main memory 801 and the dedicated circuit 802 are indispensable to form a circuit. In the semiconductor device, the whole power consumption of the semiconductor device can be reduced and heat generation can be suppressed by applying the memory circuit described in Embodiment Modes 1 to 4 to the main memory 801. The memory circuit according to Embodiment Modes 1 to 3 is applied to a non-rewritable memory circuit of the main memory 801. A main memory having a data non-rewritable region and a data rewritable region can be formed by applying the memory circuit according to Embodiment Mode 4.

Next, an explanation is given on FIG. 8B, a block diagram showing a configuration example of a semiconductor device including a CPU, a dedicated circuit, and a memory.

The semiconductor device shown in FIG. 8B includes an arithmetic circuit 810, a main memory 813, an input/output interface 816, an address bus 817, a data bus 818, and a controller bus 819. The arithmetic circuit 810 includes a CPU 811 and a dedicated circuit 812, and the main memory 813 includes a ROM 814 and a RAM 815.

The ROM 814 functions as a programming memory which stores a program executed by the CPU 811, and also stores data required for operating the dedicated circuit 812. The RAM 815 functions as a working memory for executing a program by the CPU 811.

The arithmetic circuit 810 and the main memory 813 are connected to each other through the address bus 817. Furthermore, the CPU 811, the main memory 813, and the input/output interface 816 are connected to each other through the data bus 818 and the controller bus 819.

The CPU 811 controls operation of an apparatus. Data required for the CPU 811 to execute a program is stored in the ROM 814 included in the main memory 813. The ROM 814 is a read-only memory circuit. Data stored in the ROM 814 is fixed in a making stage. Process operation of the CPU 811 and data reading from the main memory 813 are performed repeatedly since programming data necessary for the CPU 811 to execute a command or a process is stored in the ROM 814. The ROM 814 consumes electricity in reading out data necessary for operating the CPU 811. The RAM 815 is a memory circuit to which data can be written or rewritten. The RAM 815 is used mainly for storing a processing result of the CPU 811 in the process of programming. On the other hand, the dedicated circuit 812 is a circuit for executing a fixed operation, and operates processing in response to a predetermined command only. Programming data necessary for the dedicated circuit 812 to execute processing is stored in the ROM 814, and the dedicated circuit 812 can execute the processing by reading out the programming data from the ROM 814. Input of a signal from an external device and output of a signal such as a processing result to an external device are executed via the input/output interface 816.

The memory circuit according to Embodiment Modes 1 to 3 can be applied to the ROM 814. The memory circuit according to Embodiment Mode 4 can be applied to the main memory 813 including the ROM 814 and the RAM 815.

The address bus 817 is a wiring (route) for transmitting commands or data necessary for the CPU 811 to the main memory 813. The data bus 818 is a wiring (route) for reading and writing from/to the main memory 813 and for acquiring and providing data from/for external devices via the input/output interface 816. The controller bus 819 is a wiring (route) for providing controlling information to the main memory 813 and the input/output interface 816.

EMBODIMENT 1

In recent years, wireless chips have been attracting a great deal of attention as a small semiconductor device in which a micro IC chip and an antenna for radio communication are combined. With a wireless chip, data can be written and read out through transmission of communication signals (operation magnetic field) using a radio communication device (hereinafter, a reader/writer).

For example, a wireless chip can be applied for managing goods in the distribution industry. Although as for now, goods are managed with the use of bar codes in general, bar codes are scanned optically and thus data cannot be scanned if there is an obstacle. With the use of a wireless chip, on the other hand, data can be scanned by radio and thus scanning is practicable even if there is an obstacle. Therefore, goods management can be realized with more efficiency and lower cost using a wireless chip. Furthermore, a wireless chip can be applied to a wide range of use, e.g., tickets, plane tickets, automatic charge, and the like.

With extension of the application field of a wireless chip, demand for a higher-functional wireless chip has been increasing. For example, data leakage to a third party can be prevented by coding transmission/reception data. For coding data, the following methods can be given: to process coding and decoding using hardware, software, or both hardware and software. In the method of executing processing using hardware, an arithmetic circuit is configured with a dedicated circuit which executes coding and decoding. In the method of executing processing using software, an arithmetic circuit is configured with a CPU (Central Processing Unit) and a high-capacity memory, and coding and decoding programs are executed with the CPU. In the method of executing programming both using hardware and software, an arithmetic circuit is configured with a dedicated circuit, a CPU, and a memory; part of arithmetic operation for coding and decoding is executed with the dedicated circuit, and the other programs of arithmetic operation are executed with the CPU. In any one of the systems, a wireless chip is required to be equipped with a high-capacity memory. With the application of the present invention, increase of power consumption due to a higher capacity memory can be prevented.

Figure 9:
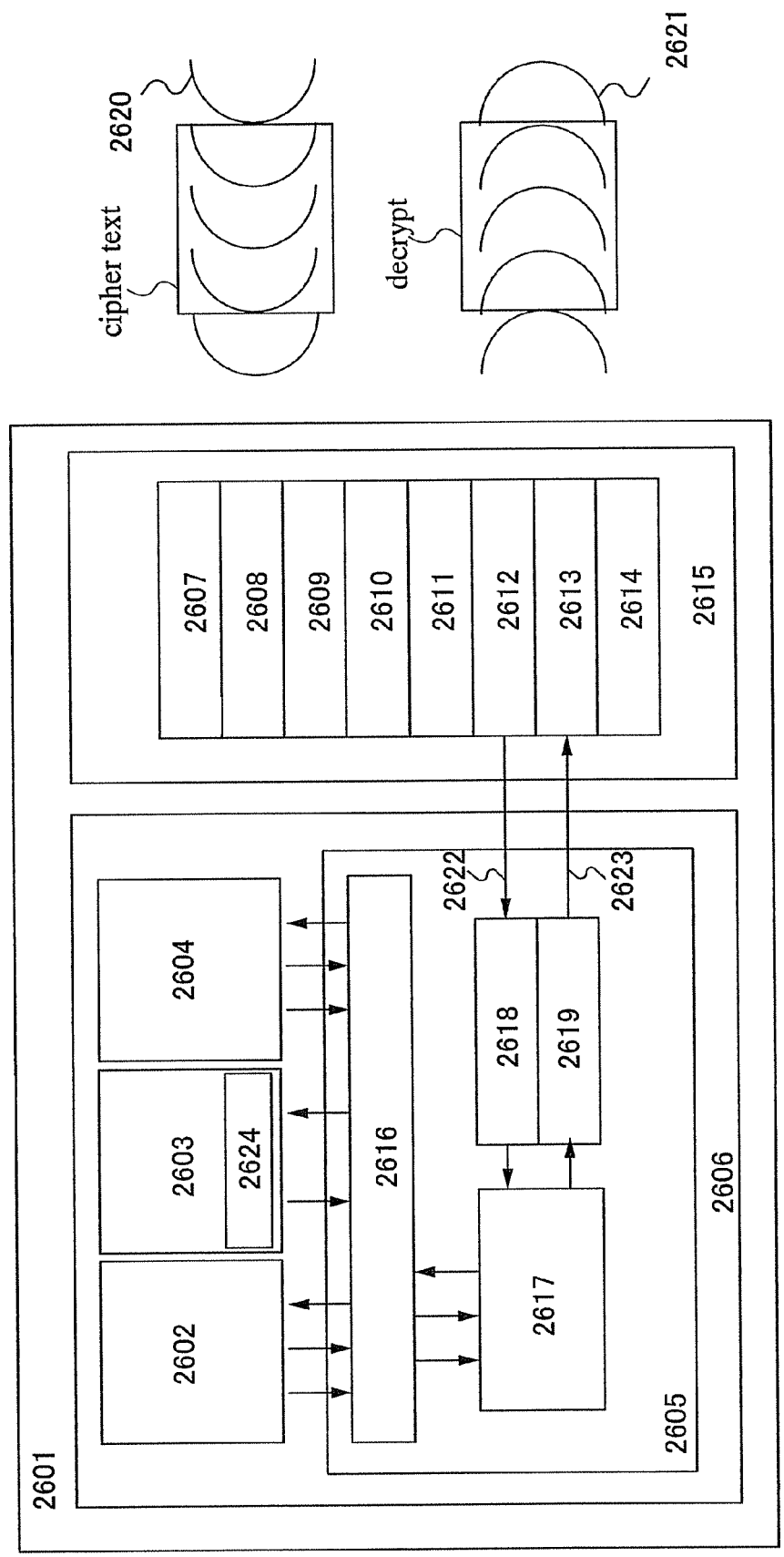
FIG. 9 is a block diagram showing a wireless chip according to the present invention.

In Embodiment 1, a wireless chip having a decoding function will be described as an example of a semiconductor device equipped with a CPU, a dedicated circuit, and a memory circuit. FIG. 9 is a block diagram of a wireless chip.

A block configuration of a wireless chip will be described with reference to FIG. 9. In FIG. 9, a wireless chip 2601 includes an arithmetic circuit 2606 and an analog unit 2615. The arithmetic circuit 2606 includes a CPU 2602, a ROM 2603, a RAM 2604, and a controller 2605. The analog unit 2615 includes an antenna 2607, a resonance circuit 2608, a power supply circuit 2609, a reset circuit 2610, a clock generation circuit 2611, a demodulation circuit 2612, a modulation circuit 2613, and a power supply management circuit 2614.

Power consumption of a whole wireless chip can be efficiently reduced by applying the memory circuit shown in Embodiment Modes 1 to 3 to the ROM 2603. Power consumption of a whole wireless chip can be efficiently reduced by applying the memory circuit shown in Embodiment Mode 4 to the RAM 2604. In addition, heat generation of the wireless chip can be reduced by reducing the power consumption.

The controller 2605 includes a CPU interface (CPUIF) 2616, a control register 2617, a code extraction circuit 2618, and an encoding circuit 2619. In FIG. 9, communication signals are shown separately as a reception signal 2620 and a transmission signal 2621 for simplicity. In fact, however, they constitute an integrated signal, and are transmitted and received at a time between the wireless chip 2601 and a reader/writer. The reception signal 2620 is received at the antenna 2607 and the resonance circuit 2608, and is demodulated in the demodulation circuit 2612. The transmission signal 2621 is modulated in the modulation circuit 2613, and is transmitted from the antenna 2607.

In FIG. 9, an induced electromotive force is generated by the antenna 2607 and the resonance circuit 2608 when the wireless chip 2601 is put in a magnetic field formed by a communication signal. The induced electromotive force is held by capacitance in the power supply circuit 2609, and the potential is stabilized by the capacitance and supplied to each circuit in the wireless chip 2601 as a power supply voltage. The reset circuit 2610 generates an initial reset signal of the whole wireless chip 2601. For example, a signal that rises after the increase in the power supply voltage is generated as a reset signal. In the clock generation circuit 2611, a frequency and duty ratio of a clock signal is changed according to a control signal generated in the power supply management circuit 2614. In the demodulation circuit 2612, a change of the amplitude of the reception signal 2620 modulated by an ASK method is detected as the reception data 2622 of "0"/"1". The demodulation circuit 2612 corresponds to a low-pass filter, for example. The modulation circuit 2613 transmits transmission data after changing the amplitude of the ASK transmission signal 2621. For example, if the transmission data 2623 is "0", the resonance point of the resonance circuit 2608 is changed to change the amplitude of the communication signal. The power supply management circuit 2614 monitors a power supply voltage which is supplied from the power supply circuit 2609 to the arithmetic circuit 2606 and the current consumption in the arithmetic circuit 2606, and generates a control signal for changing the frequency and duty ratio of the clock signal in the clock generation circuit 2611.

An operation of the wireless chip of Embodiment Mode 1 is described. First, the reception signal 2620 including ciphertext data, which is transmitted from the reader/writer, is received by the wireless chip 2601. The reception signal 2620 is demodulated in the demodulation circuit 2612, and then divided in the code extraction circuit 2618 into a control command, ciphertext data, and the like, which are subsequently stored in the control register 2617. Here, the control command is data specifying a response of the wireless chip 2601, for example, transmission of a unique ID number, operation stop, cipher breaking, and the like. In this embodiment, a control command of cipher breaking is to be received.

Next, in the arithmetic circuit 2606, the CPU 2602 breaks (decodes) the ciphertext according to a code breaking program stored in the ROM 2603 by using a secret key 2624 stored in advance in the ROM 2603. The decoded ciphertext (decoded text) is stored in the control register 2617. At this time, the RAM 2604 is used as a data storing area. Note that the CPU 2602 accesses the ROM 2603, the RAM 2604, and the control register 2617 through the CPUIF 2616. The CPUIF 2616 has a function of generating an access signal for any of the ROM 2603, the RAM 2604, and the control register 2617 based on an address required by the CPU 2602.

The encoding circuit 2619 generates the transmission data 2623 from the decoded text, which is then modulated in the modulation circuit 2613. Next, the transmission signal 2621 is transmitted from the antenna 2607 to the reader/writer.

Note that Embodiment 1 has described, as an arithmetic method, a processing method using software, that is, a method in which the arithmetic circuit is configured with the CPU and the high-capacity memory, and a program is executed by the CPU; however, it is also possible to select an optimum arithmetic method according to the purpose and form the arithmetic circuit based on the selected method. For example, as an arithmetic method, there are methods of performing the processing using hardware and using both hardware and software. In the method of processing using hardware, an arithmetic circuit may be a dedicated circuit. In the method of processing using both hardware and software, an arithmetic circuit may include a dedicated circuit, a CPU, and a memory so that the dedicated circuit may perform part of arithmetic operation and that the CPU may execute programs of the other part of arithmetic operation.

EMBODIMENT 2

In Embodiment 2, a method for making a wireless chip will be described. Each circuit included in a wireless chip according to the present invention can be formed using thin film transistors. In Embodiment 2, a circuit included in a wireless chip is formed using thin film transistors, and the circuit is transferred from a substrate used for making thin film transistors to a flexible substrate; thus a flexible wireless ship is formed.

In Embodiment Mode 2, a p-channel TFT (also referred to as a "pch-TFT") and an n-channel TFT (also referred to as an "nch-TFT") which constitute an inverter or the like, a capacitor, and an n-channel TFT with high withstand voltage which is provided in a power supply circuit, and the like are given as representative circuits forming a wireless chip. Hereafter, a method for making a wireless chip will be described with reference to cross-sectional views shown in FIGS. 10A to 15.

Figure 10A:
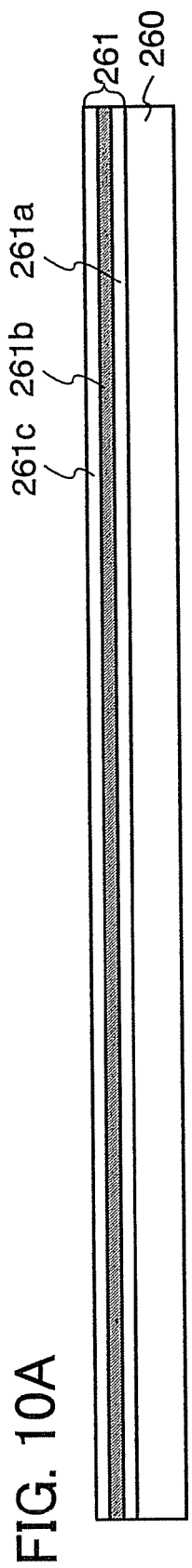
FIGS. 10A to 10D are cross-sectional views illustrating the steps of making the wireless chip according to the present invention.

A glass substrate is used for a substrate 260. As is shown in FIG. 10A, a separation layer 261 composed of a first layer 261a to a third layer 261c is formed over the substrate 260. As the first layer 261a, a silicon oxynitride ($SiO_xN_y$, x>y>0) film is formed with a parallel-plate plasma CVD apparatus, using $SiH_4$ and $N_2O$ for a source gas, to have a thickness of 100 nm. As the second layer 261b, a tungsten film is formed to have a thickness of 30 nm using a sputtering apparatus. As the third layer 261c, a silicon oxide film is formed to have a thickness of 200 nm using a sputtering apparatus.

By forming the third layer 261c (made of silicon oxide), the surface of the second layer 261b (made of tungsten) is oxidized and a tungsten oxide is formed at the interface. Owing to the tungsten oxide, the substrate 260 is easy to be separated when an element forming layer 250 is transferred to another substrate afterward. The first layer 261a keeps adhesion of the second layer 261b during formation of the element forming layer 250.

For the second layer 261b, it is preferable to use a metal film of molybdenum, titanium, niobium, nickel, cobalt, zirconium, zinc, ruthenium, rhodium, palladium, osmium, iridium as well as tungsten, or a compound thereof. Furthermore, the thickness of the second layer 261b can be 20 to 40 nm.

Figure 10B:
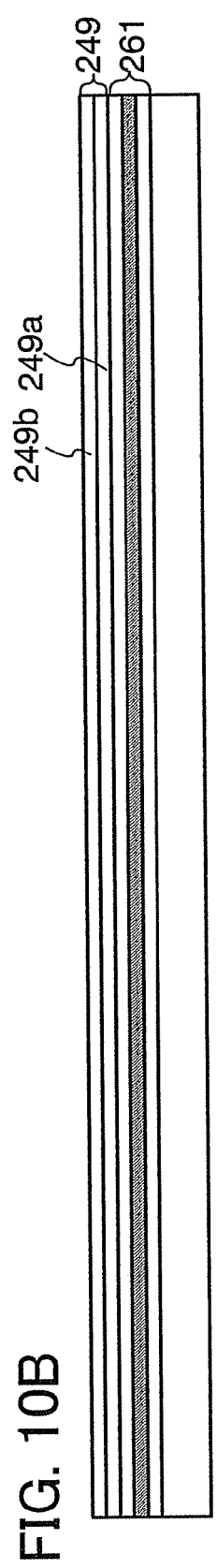

As is shown in FIG. 10B, a base insulating layer 249 having a two-layer structure is formed over the separation layer 261. As a first layer 249a, a silicon nitride oxide ($SiN_xO_y$, x>y>0) film is formed with a plasma CVD apparatus, using $SiH_4$, $N_2O$, $NH_3$, and $H_2$ for a source gas, to have a thickness of 50 nm. The first layer 249a has a composition ratio of 40% or more of nitride to improve in barrier property. As a second layer 249b, a silicon oxynitride ($SiO_xN_y$, x>y>0) film is formed by a plasma CVD apparatus, using $N_2O$ for a source gas, to have a thickness of 100 nm. The composition ratio of nitride in the second layer 249b is 0.5% or less.

Figure 10C:
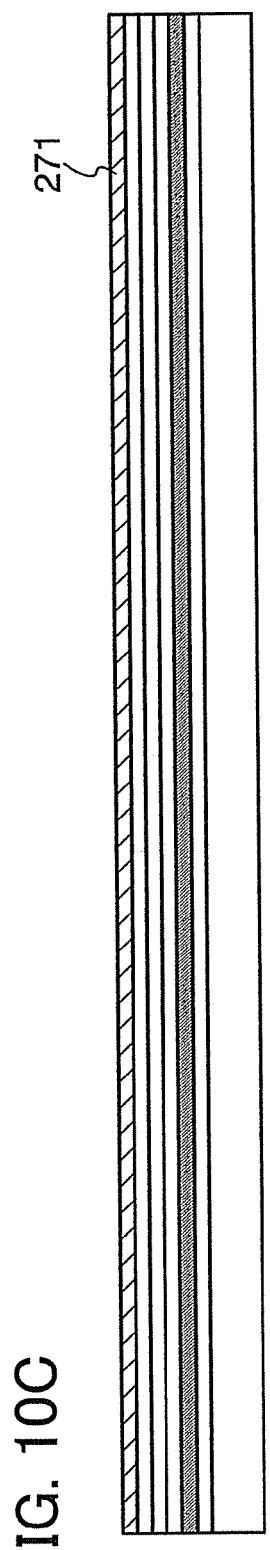

As is shown in FIG. 10C, a crystalline silicon film 271 is formed over the base insulating layer 249. The crystalline silicon film 271 is formed by the following method: forming an amorphous silicon film by a plasma CVD apparatus, with the use of $SiH_4$ and $H_2$ for a source gas, to have a thickness of 66 nm, and irradiating the amorphous silicon film with laser so that the amorphous silicon film is crystallized to be the crystalline silicon film 271. An example of a laser irradiation method is as follows: the amorphous silicon film is irradiated with a second harmonic of LD-pumped $YVO_4$ laser (a wavelength of 532 nm). Although the frequency is not necessarily limited to the second harmonic, the second harmonic is superior to a third or higher harmonic in point of energy efficiency. An optical system is adjusted so that the beam on the irradiation surface has a linear shape with a length of about 500 μm, a width of about 20 μm, and an intensity of 10 to 20 W. In addition, the beam is moved at a speed of 10 to 50 cm/sec relative to the substrate.

After forming the crystalline silicon film 271, a p-type impurity is added thereto. In this embodiment, diborane ($B_2H_6$) diluted with hydrogen is used for a doping gas and boron is added to the whole crystalline silicon film 271 using an ion doping apparatus. Crystalline silicon which is formed by crystallizing amorphous silicon is not ideal intrinsic silicon and exhibits weak n-type conductivity since it has a dangling bond. Therefore, the crystalline silicon film 271 turns into intrinsic silicon by doping a small amount of p-type impurity. This process may be carried out when necessary.

Figure 10D:
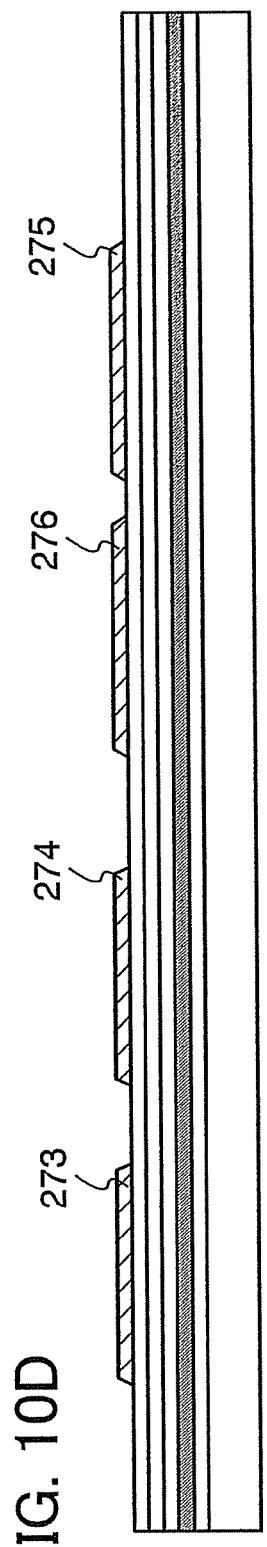

As is shown in FIG. 10D, the crystalline silicon film 271 is divided into elements, so that semiconductor layers 273 to 276 are formed. In the semiconductor layers 273 to 275 each, a channel forming region, source region, and a drain region of a TFT are formed. The semiconductor layer 276 functions as an electrode of an MIS capacitor. An example of a method for processing the crystalline silicon film 271 is as follows: a resist is formed over the crystalline silicon film 271 through a photolithography process, and using the resist as a mask, the crystalline silicon film 271 is etched with the use of $SF_6$ and $O_2$ for an etching agent in a dry-etching apparatus; in this manner, the semiconductor layers 273 to 276 having predetermined shapes are formed.

As is shown in FIG. 11A, a resist R31 is formed through a photolithography process and a small amount of p-type impurity is added to the semiconductor layers 274 and 275 of n-channel TFTs. In this embodiment, using diborane ($B_2H_6$) diluted with hydrogen for a doping gas, boron is added to the semiconductor layers 274 and 275 using an ion doping apparatus. After doping, the resist R31 is removed.

The objective of the step shown in FIG. 11A is to prevent the threshold voltage of the n-channel TFT from turning into a negative voltage. Boron may be added to the semiconductor layers 274 and 275 of the n-channel TFTs at a concentration of $5\times10^{15}$ to $1\times10^{17}$ atoms/cm$^3$. The step shown in FIG. 11A may be carried out when necessary.

As is shown in FIG. 11B, an insulating film 277 is formed over the entire surface of the substrate 260. The insulating film 277 functions as a gate insulating film of a TFT and a dielectric of a capacitor. In this embodiment, a silicon oxynitride ($SiO_xN_y$, x>y>0) film is formed with a plasma CVD apparatus, using $SiH_4$ and $N_2O$ for a source gas to have thicknesses of 20 to 40 nm.

As is shown in FIG. 11C, a resist R32 is formed through a photolithography process and an n-type impurity is added to the semiconductor layer 276 of a capacitor. Using phosphine ($PH_3$) which is diluted with hydrogen for a doping gas, the semiconductor layer 276 is doped with phosphorus using an ion doping apparatus and an n-type impurity region 279 is formed in the entire semiconductor layer 276. After doping, the resist R32 is removed.

As is shown in FIG. 11D, a conductive film 281 is formed over the insulating film 277. The conductive film 281 functions as a gate electrode of a TFT or the like. In this embodiment, the conductive film 281 is formed to have a multi-layer structure of two layers. The first layer is tantalum nitride with a thickness of 30 nm, and the second layer is tungsten with a thickness of 370 nm in this embodiment. Films of tantalum nitride and of tungsten are formed using a sputtering apparatus.

After forming a resist on the conductive film 281 through a photolithography process, the conductive film 281 is etched using an etching apparatus. In this manner, first conductive films 284 to 286 are formed over the semiconductor layers 273 to 276, as is shown in FIG. 12A. The first conductive films 283 to 285 each serves as a gate electrode or a gate wiring of a TFT. In an n-channel TFT with high withstand voltage, the conductive film 285 is formed so as to have a wider gate width (channel length) compared to those in other TFTs. The first conductive film 286 functions as the other electrode of the capacitor.

The conductive film 281 is etched by a dry-etching method. An ICP (Inductively Coupled Plasma) etching apparatus is used for an etching apparatus. As an etching agent, mixed gas of $Cl_2$, $SF_6$, and $O_2$ is used in order to etch tungsten first; next, the etching agent to put in a process chamber is changed to $Cl_2$ gas only, so that tantalum nitride is etched.

As is shown in FIG. 12B, a resist R33 is formed through a photolithography process. The semiconductor layers 274 and 275 of the n-channel TFTs are doped with an n-type impurity. The first conductive film 284 functioning as a mask, n-type low-concentration impurity regions 288 and 289 are formed in the semiconductor layer 274 in a self-aligned manner. The first conductive film 285 functioning as a mask, n-type low-concentration impurity regions 290 and 291 are formed in the semiconductor layer 275 in a self-aligned manner. Using phosphine $PH_3$ diluted with hydrogen for a doping gas, the semiconductor layers 274 and 275 are doped with phosphorus using an ion doping apparatus. The objective of the process shown in FIG. 12B is to form LDD regions in the n-channel TFTs. The process is performed so that an n-type impurity is included in the n-type low-concentration impurity regions 288 and 289 at a concentration of $1\times10^{16}$ to $5\times10^{18}$ atoms/cm$^3$.

As is shown in FIG. 12C, a resist R34 is formed through a photolithography process and the semiconductor layer 273 of a p-channel TFT is doped with a p-type impurity. In the semiconductor layer 273, an exposed region becomes a p-type impurity region 273p since a portion to be left as an n-type impurity region 273n is covered with the resist R34. The first conductive film 283 functioning as a mask, p-type high-concentration impurity regions 273a and 273b are formed in the semiconductor layer 273 in a self-aligned manner. Furthermore, a region 273c covered with the first conductive film 283 is formed as a channel forming region in a self-aligned manner. In doping the semiconductor layer with the p-type impurity, diborane ($B_2H_6$) diluted with hydrogen is used for a doping gas. After doping, the resist R34 is removed.

As is shown in FIG. 12D, insulating layers 293 to 296 are formed around the first conductive films 283 to 286. The insulating layers 293 to 296 are referred to as sidewalls. First, a silicon oxynitride ($SiO_xN_y$, x>y>0) film is formed with a plasma CVD apparatus, using $SiH_4$ and $N_2O$ for a source gas, to have a thickness of 100 nm. Next, a silicon oxide film is formed with an LPCVD apparatus, using $SiH_4$ and $N_2O$ for source gas, to have a thickness of 200 nm. A resist is formed through a photolithography process. First, using the resist, the silicon oxide film of the upper layer is wet-etched with buffered hydrofluoric acid. Next, after removing the resist, the silicon oxynitride film of the lower layer is dry-etched. In this manner, the insulating layers 293 to 296 are formed. Through the series of process, the insulating film 277, which is composed of silicon oxynitride, is also etched and left only under the first conductive films 283 to 285 and the insulating films 293 to 296.

Figure 13A:
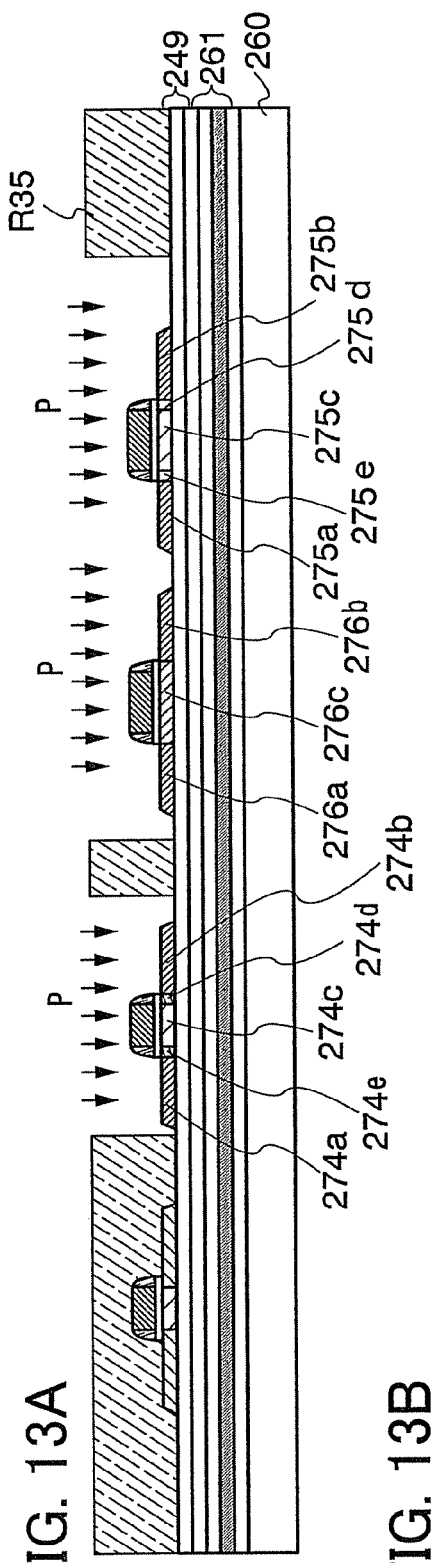
FIGS. 13A to 13C are cross-sectional views illustrating the steps of making the wireless chip according to the present invention.

As is shown in FIG. 13A, a resist R35 is formed through a photolithography process. The semiconductor layers 274 and 275 of the n-channel TFTs and the semiconductor layer of the capacitor are doped with an n-type impurity, so that n-type high-concentration impurity regions are formed. In the semiconductor layer 274, the n-type low-concentration impurity regions 288 and 289 are doped with an n-type impurity, with the first conductive film 284 and the insulating layer 294 functioning as masks. As a result, n-type high-concentration impurity regions 274a and 274b are formed in a self-aligned manner. A region 274c overlapping with the first conductive film 284 is defined as a channel forming region in a self-aligned manner. Further, regions 274e and 274d overlapping with the insulating layer 294 in the n-type low-concentration impurity regions 288 and 289 are defined as n-type low-concentration impurity regions. In the semiconductor layer 275, as in the semiconductor layer 274, n-type high-concentration impurity regions 275a and 275b, a channel forming region 275c, and n-type low-concentration impurity regions 275e and 275d are formed. Further, the n-type impurity region 279 is doped with an n-type impurity, with the first conductive film 286 and the insulating layer 296 functioning as masks. Thus, n-type high-concentration impurity regions 276a and 276b are formed in a self-aligned manner A region of the semiconductor layer 276 overlapping with the first conductive film 286 and the insulating layer 296 is defined as an n-type impurity region 276c.

In a process of adding an n-type impurity, as is described above, an ion doping apparatus may be used and phosphine ($PH_3$) diluted with hydrogen may be used for a doping gas. The n-type high-concentration impurity regions 274a, 274b, 275a, and 275b are doped with phosphorus at a concentration of $1 \times 10^{20}$ to $2 \times 10^{21}$ atoms/cm$^3$.

Figure 13B:
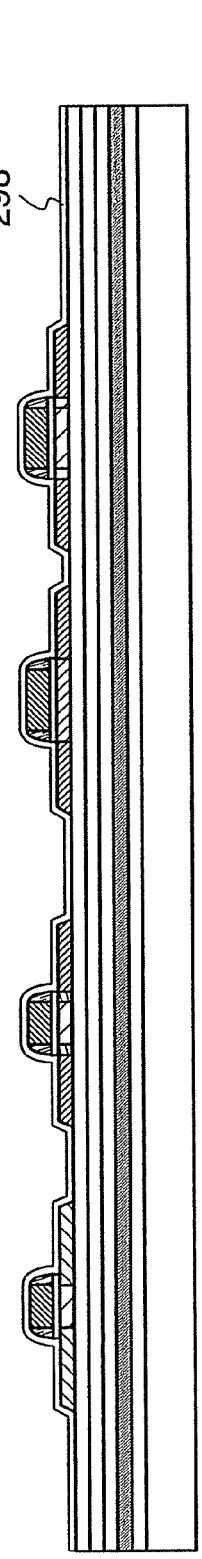

The resist R35 is removed and a cap insulating film 298 is formed as shown in FIG. 13B. As the cap insulating film 298, a silicon oxynitride ($SiO_xN_y$, x>y>0) film is formed using a plasma CVD apparatus to have a thickness of 50 nm. $SiH_4$ and $N_2O$ are used for a source gas of the silicon oxynitride film. After forming the cap insulating film 298, heat treatment is carried out in a nitrogen atmosphere at 550, so that the n-type impurity and p-type impurity added to the semiconductor layers 273 to 276 are activated.

Figure 13C:
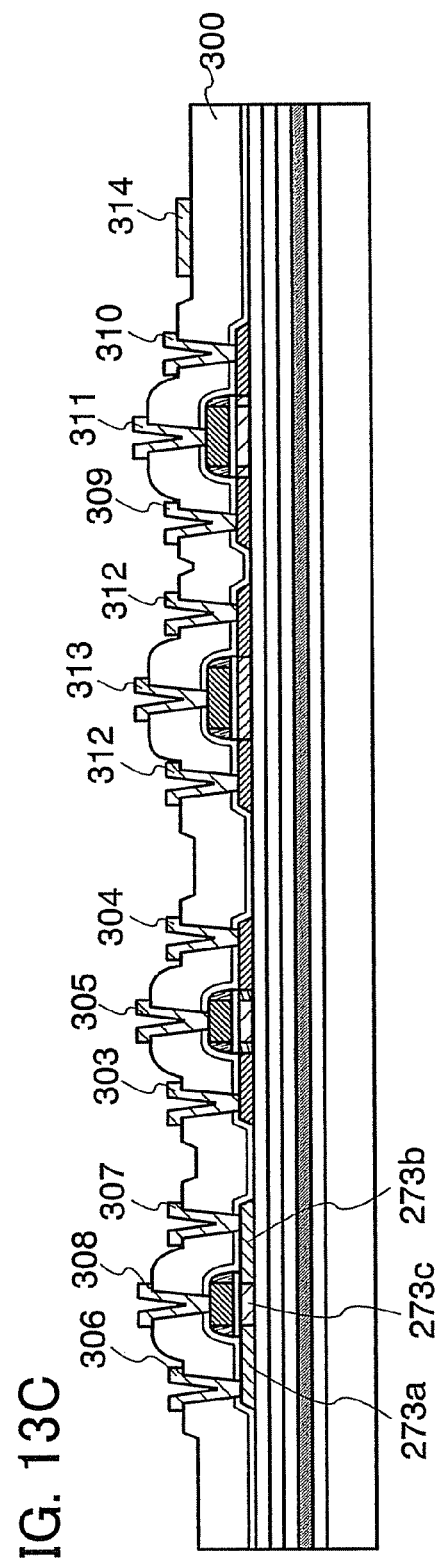

As is shown in FIG. 13C, a first interlayer insulating film 300 is formed. The first interlayer insulating film 300 is formed to have a two-layer structure. As a first insulating film, silicon nitride oxide ($SiN_xO_y$, x>y>0) film is formed with a plasma CVD apparatus, using $SiH_4$ and $N_2O$ for a source gas, to have a thickness of 100 nm. As a second insulating film, silicon oxynitride ($SiO_xN_y$, x>y>0) film is formed with a plasma CVD apparatus, using $SiH_4$, $N_2O$, $NH_3$, and $H_2$ for a source gas, to have a thickness of 600 nm.

Through a photolithography process and a dry-etching process, the first interlayer insulating film 300 and the cap insulating film 298 are removed and contact holes are formed. A conductive film is formed over the first interlayer insulating film 300. In this embodiment, the conductive film is formed to have a four-layer structure. A titanium layer, a titanium nitride layer, a pure aluminum layer, and a titanium nitride layer are in sequence stacked to have thicknesses of 60 nm, 40 nm, 500 nm, and 100 nm, respectively. Each layer is formed using a sputtering apparatus. Through a photolithography process and a dry-etching process, the conductive films are patterned into a predetermined shape and second conductive films 303 to 314 are formed.

Although the second conductive films and the first conductive films are connected to each other over the semiconductor layer in the drawing in order to explain the connection between the second conductive films and the first conductive films, in practice, the second conductive layers and the first conductive layer are formed so that the contact portion therebetween does not overlap with the semiconductor layer.

The n-type high-concentration impurity regions 276a and 276b are connected to each other via the second conductive film 312. Thus, an MIS capacitor with a laminated structure including the n-type impurity region 276c, the insulating film 277, and the first conductive film 286 is formed. The second conductive film 314 is a terminal of an antenna circuit and is connected to an antenna 322.

Figures 14A, 14B:
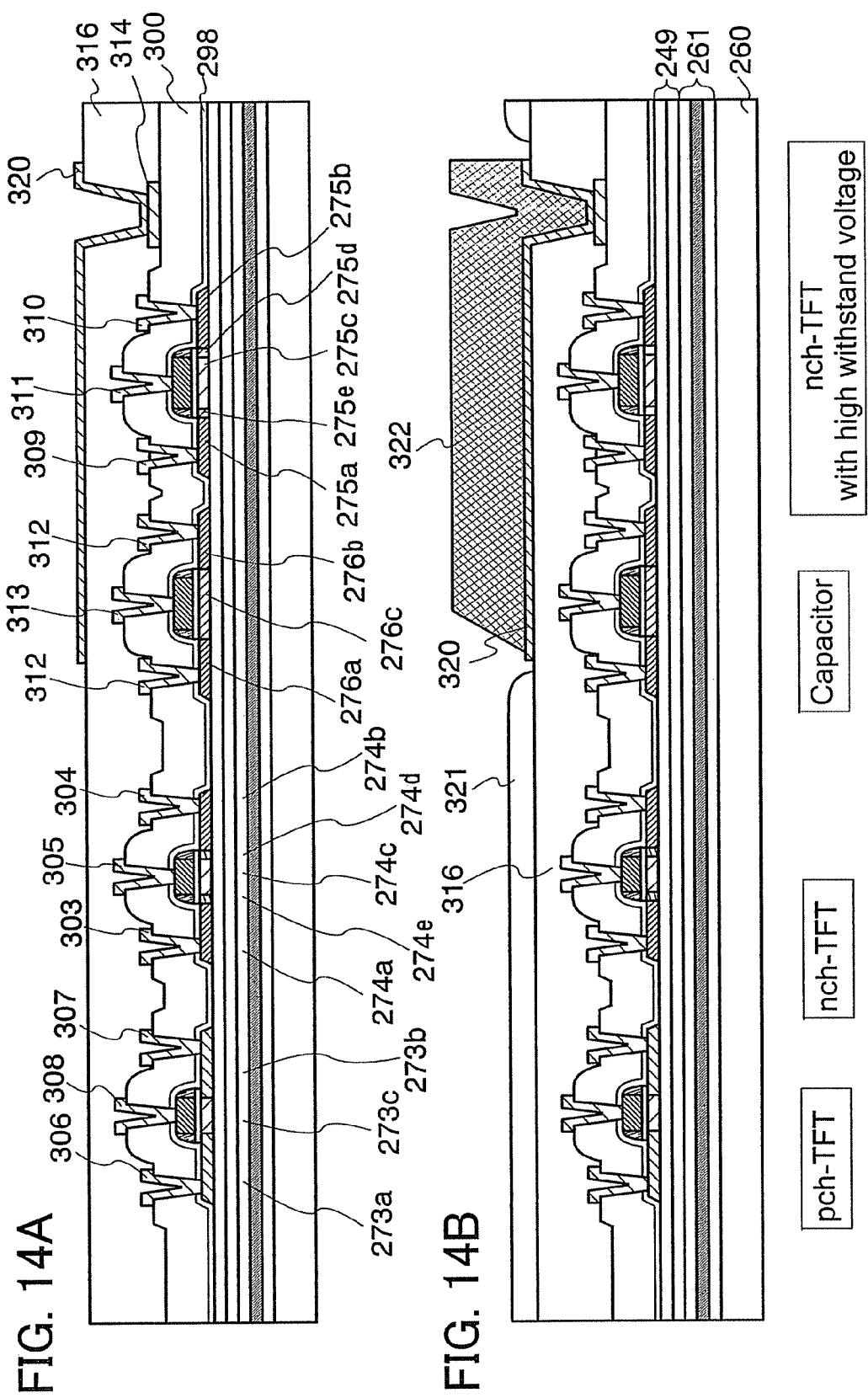
FIGS. 14A and 14B are cross-sectional views illustrating the steps of making the wireless chip according to the present invention.

As is shown in FIG. 14A, a second interlayer insulating film 316 is formed. In the second interlayer insulating film 316, a contact hole reaching the second conductive film 314 is formed. An example of forming the second interlayer insulating film 316 with photosensitive polyimide is as follows: polyimide is applied with a thickness of 1.5 µm using a spinner; the polyimide is exposed and developed through a photolithography process, so that a contact hole is formed in the polyimide; after the development, the polyimide is baked.

Furthermore, a conductive film is formed over the second interlayer insulating film 316. Through a photolithography process and an etching process, the conductive film is processed into a predetermined shape and thus a third conductive film 320 is formed. As the third conductive film 320, a Ti film is formed using a sputtering apparatus with a thickness of 100 nm. The third conductive film 320 functions as a bump of an antenna to connect the antenna 322 with the terminal of the antenna circuit (the second conductive film 314).

As is shown in FIG. 14B, a third interlayer insulating film 321 with an opening is formed. In this embodiment, by the same method as that of forming the second interlayer insulating film 316, the third interlayer insulating film 321 is formed with photosensitive polyimide. The opening is made at the region where the antenna 322 is formed.

As is shown in FIG. 14B, the antenna 322 is formed. Aluminum is evaporated using a metal mask in an evaporation apparatus, so that the antenna 322 with a predetermined shape is formed in the opening.

Figure 15:
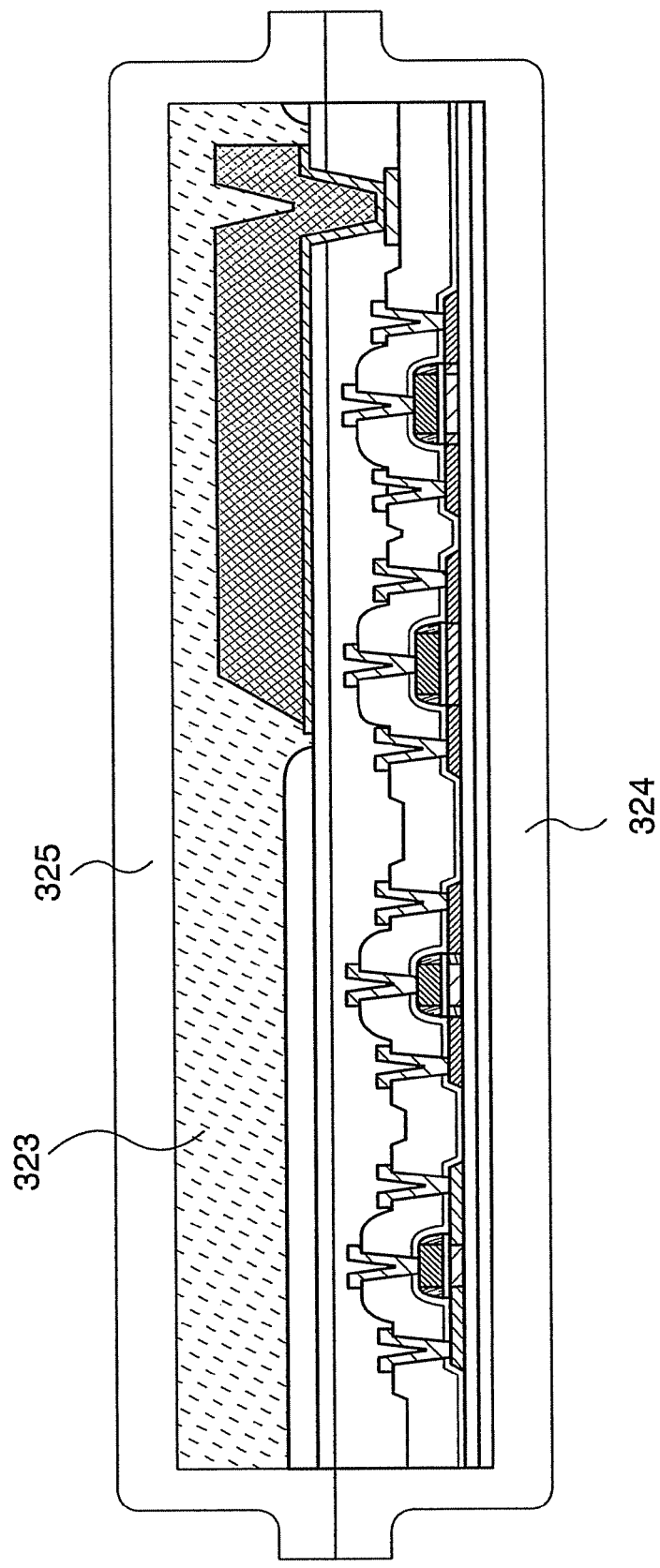
FIG. 15 is a cross-sectional view illustrating the step of making the wireless chip according to the present invention.

Through the steps shown in FIGS. 11A to 14B, a circuit to constitute a wireless chip is formed over the substrate 260. Next, as shown in FIG. 15, a process of sealing the wireless chip with a flexible substrate will be described.

A protective insulating layer 323 is formed to protect the antenna 322. Through a photolithography process and an etching process, or laser irradiation, the insulating film stacked over the substrate 260 and the protective insulating layer 323 are removed, so that an opening which reaches the separation layer 261 is made. A multitude of circuits forming a number of same wireless chips are formed over the substrate 260. The circuits are separated for every wireless chip.

Next, the substrate 260 is separated after fixing a substrate for transferring on the protective insulating layer 323. Since the junction of the interface between the second layer 261b and the third layer 261c of the separation layer 261 is weak, separation of the substrate 260 proceeds from the edge of the opening when physical force is applied. Thus, the substrate 260 can be separated from the element forming layer 250. A flexible substrate 324 is fixed with an adhesive on the base insulating layer 249, from which the substrate 260 has been separated. After that, the substrate for transferring is detached. Another flexible substrate 325 is fixed on the protective insulating layer 323 with an adhesive. Through heat treatment with applying pressure from the outside of the flexible substrate 324 and the flexible substrate 325, a circuit to constitute a wireless chip is sealed with the flexible substrate 324 and the flexible substrate 325.

In Embodiment Mode 2, an example has been explained where the antenna 322 as well as the thin film transistor is formed. However, an external antenna can be employed alternatively.

In Embodiment Mode 2, an example has been explained where the substrate 260 used in making a wireless chip is separated. However, the substrate used in making a wireless chip can also be left. In this case, the substrate may be polished or ground to be thinned so that the substrate will be flexible.

According to Embodiment Mode 2, a flexible, thin, and lightweight wireless chip can be made. A method for separating the substrate shown in the present embodiment mode is not limited to a method for making a wireless chip; by applying it to a method of making another semiconductor device, a flexible semiconductor device can be made.

Note that Embodiment Mode 2 can be implemented freely in combination with other embodiment modes or embodiments.

EMBODIMENT 3

Some uses of a semiconductor device 3000, which functions as the wireless chip described in the above embodiment modes, will be described with reference to FIGS. 16A to 16F.

Figure 16A:
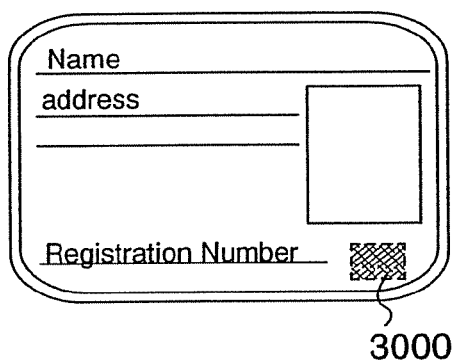
FIGS. 16A to 16F illustrate uses of the wireless chip according to the present invention.
Figure 16B:
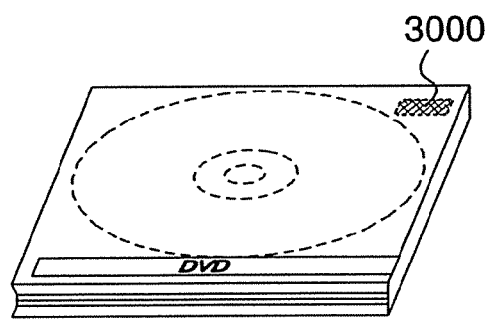
Figure 16C:
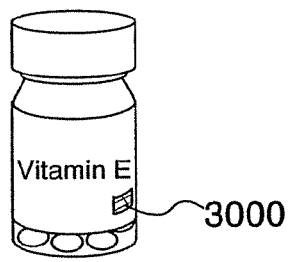
Figure 16D:
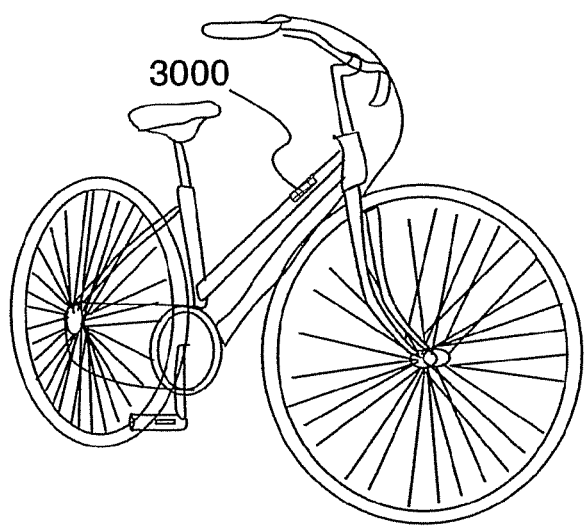
Figure 16E:
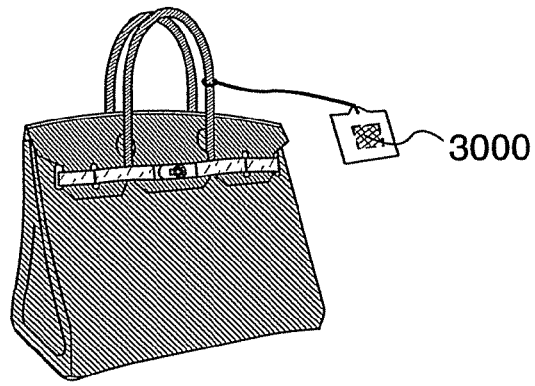
Figure 16F:
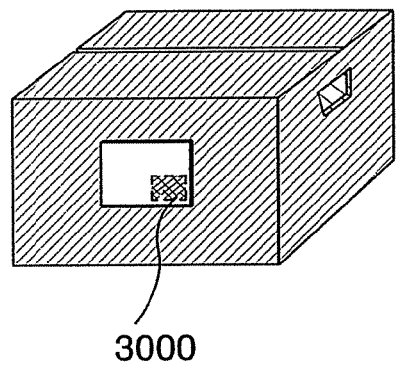

Wireless chips can be employed for many uses and can be used by being mounted in objects such as bills, coins, securities, bearer bonds, certificates (driver's licenses, resident cards, and the like; refer to FIG. 16A), containers for wrapping objects (wrapping paper, bottles, and the like; refer to FIG. 16C), recording media (DVD software, video tapes, and the like; refer to FIG. 16B), vehicles (bicycles and the like; refer to FIG. 16D), personal belongings (bags, glasses, and the like), foods, plants, animals, human bodies, clothes, daily necessities, and products such as electronic devices, or shipping tags of baggage (refer to FIGS. 16E and 16F). The electronic device means a liquid crystal display device, an EL display device, a television unit (also referred to simply as a TV, TV set, or TV receiver), a cellular phone, or the like.

The semiconductor device 3000 according to the present invention includes the memory element of the present invention, and is mounted on a printed wiring board, attached to a surface, or incorporated to be fixed in an object. For example, the semiconductor device is incorporated in paper of a book, or an organic resin of a package to be fixed in each object. As for the semiconductor device 3000 according to the present invention, a small size, a thin shape and a lightweight are achieved and thus, the design of the object is not impaired even after being fixed in the object. Further, by providing the semiconductor device 3000 according to the present invention in bills, coins, securities, bearer bonds, certificates, and the like, an identification function can be obtained and forgery thereof can be prevented by utilizing the identification function. Furthermore, by providing the semiconductor device 3000 according to the present invention in containers for wrapping devices, recording media, personal belongings, foods, clothes, daily necessities, electronic devices, and the like, a system such as an inspection system can be carried out efficiently.

The present application is based on Japanese Priority application No. 2006-240540 filed on Sep. 5, 2006 with the Japanese Patent Office, the entire contents of which are hereby incorporated by reference.

What is claimed is:

1. A semiconductor device comprising:
a memory circuit; and
a central processing unit configured to execute a program based on data stored in the memory circuit,
wherein The memory circuit includes:
    word lines;
    bit lines intersecting the word lines;
    a latch circuit comprising two inverter circuits; and
    memory cells provided at intersecting areas of the word lines and the bit lines, either high or low potential is stored in each of the memory cells,
    wherein the high potential is stored in a first plurality of the memory cells, and the low potential is stored in a second plurality of the memory cells,
    wherein a semiconductor element is connected to one of the word lines and one of the bit lines, at one of the memory cells of smaller number of the first plurality and the second plurality, and
    wherein a vacant cell is not provided with the semiconductor element, at one of the memory cells of larger number of the first plurality and the second plurality.

2. A semiconductor device comprising:
a memory circuit; and
a dedicated circuit configured to execute an arithmetic operation based on data stored in the memory circuit,
wherein the memory circuit includes:
    word lines;
    bit lines intersecting the word lines;
    a latch circuit comprising two inverter circuits; and
    memory cells provided at intersecting areas of the word lines and the bit lines, either high or low potential is stored in each of the memory cells,
    wherein the high potential is stored in a first plurality of the memory cells, and the low potential is stored in a second plurality of the memory cells,
    wherein a semiconductor element is connected to one of the word lines and one of the bit lines, at one of the memory cells of smaller number of the first plurality and the second plurality, and
    wherein a vacant cell is not provided with the semiconductor element, at one of the memory cells of larger number of the first plurality and the second plurality.

3. A semiconductor device comprising:
a memory circuit;
a central processing unit configured to execute a program based on data stored in the memory circuit; and
a dedicated circuit configured to execute an arithmetic operation based on data stored in the memory circuit,
wherein the memory circuit includes:
    word lines;
    bit lines intersecting the word lines;
    a latch circuit comprising two inverter circuits; and
    memory cells provided at intersecting areas of the word lines and the bit lines, either high or low potential is stored in each of the memory cells,
    wherein the high potential is stored in a first plurality of the memory cells, and the low potential is stored in a second plurality of the memory cells,
    wherein a semiconductor element is connected to one of the word lines and one of the bit lines, at one of the memory cells of smaller number of the first plurality and the second plurality, and
    wherein a vacant cell is not provided with the semiconductor element, at one of the memory cells of larger number of the first plurality and the second plurality.

4. The semiconductor device according to claim 1,
wherein the memory circuit further comprising:
an output line connected to one of the bit lines;
a latch circuit for holding potential of the one of the bit lines, connected between the output line and one of the memory cells; and
a pre-charge circuit for changing potential of the one of the bit lines, connected between the latch circuit and the output line.

5. The semiconductor device according to claim 2,
wherein the memory circuit further comprising:
an output line connected to one of the bit lines;
a latch circuit for holding potential of the one of the bit lines, connected between the output line and one of the memory cells; and
a pre-charge circuit for changing potential of the one of the bit lines, connected between the latch circuit and the output line.

6. The semiconductor device according to claim 3,
wherein the memory circuit further comprising:
an output line connected to one of the bit lines;
a latch circuit for holding potential of the one of the bit lines, connected between the output line and one of the memory cells; and
a pre-charge circuit for changing potential of the one of the bit lines, connected between the latch circuit and the output line.

7. The semiconductor device according to claim 1,
wherein the semiconductor element is a transistor connected to a terminal of a ground potential.

8. The semiconductor device according to claim 2,
wherein the semiconductor element is a transistor connected to a terminal of a ground potential.

9. The semiconductor device according to claim 3,
wherein the semiconductor element is a transistor connected to a terminal of a ground potential.

10. The semiconductor device according to claim 1,
wherein the semiconductor element is a memory transistor.

11. The semiconductor device according to claim 2,
wherein the semiconductor element is a memory transistor.

12. The semiconductor device according to claim 3,
wherein the semiconductor element is a memory transistor.

* * * * *